(12) United States Patent
Tabata et al.

(10) Patent No.: US 10,755,944 B2
(45) Date of Patent: Aug. 25, 2020

(54) ETCHING METHOD AND PLASMA PROCESSING APPARATUS

(71) Applicant: TOKYO ELECTRON LIMITED, Tokyo (JP)

(72) Inventors: Masahiro Tabata, Miyagi (JP); Sho Kumakura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/212,835

(22) Filed: Dec. 7, 2018

(65) Prior Publication Data
US 2019/0259626 A1  Aug. 22, 2019

(30) Foreign Application Priority Data

Feb. 16, 2018  (JP) .................... 2018-025968

(51) Int. Cl.
*H01L 21/311* (2006.01)
*H01L 21/67* (2006.01)
*H01J 37/32* (2006.01)

(52) U.S. Cl.
CPC .. *H01L 21/31116* (2013.01); *H01J 37/32449* (2013.01); *H01J 37/32568* (2013.01); *H01J 37/32715* (2013.01); *H01J 37/32834* (2013.01); *H01L 21/67069* (2013.01); *H01J 2237/334* (2013.01)

(58) Field of Classification Search
CPC ......... H01L 21/31116; H01L 21/67069; H01L 29/66795; H01J 37/32715; H01J 37/32449; H01J 37/32568; H01J 37/32834; H01J 2237/334
See application file for complete search history.

(56) References Cited

U.S. PATENT DOCUMENTS 7,977,249 B1 * 7/2011 Liu ................... H01L 21/31111
216/79
2018/0005850 A1 * 1/2018 Citla ................. H01L 21/67069

FOREIGN PATENT DOCUMENTS

JP   2003-229418 A   8/2003

\* cited by examiner

*Primary Examiner* — Duy Vu N Deo
(74) *Attorney, Agent, or Firm* — Rothwell, Figg, Ernst & Manbeck, P.C.

(57) ABSTRACT

An etching method selectively etches a first region of a substrate with respect to a second region of the substrate. At least a portion of the first region, which includes the surface of the first region, is modified by plasma to form a first modified region. At least a portion of the second region, which includes the surface of the second region, is modified by plasma to form a second modified region. The first modified region is selectively etched with respect to the second modified region by plasma.

16 Claims, 17 Drawing Sheets

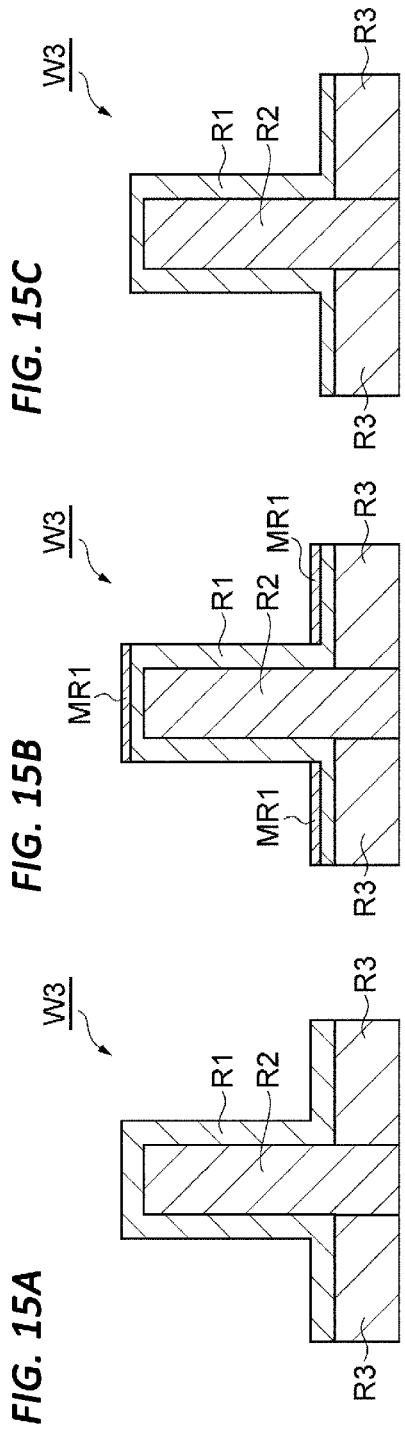
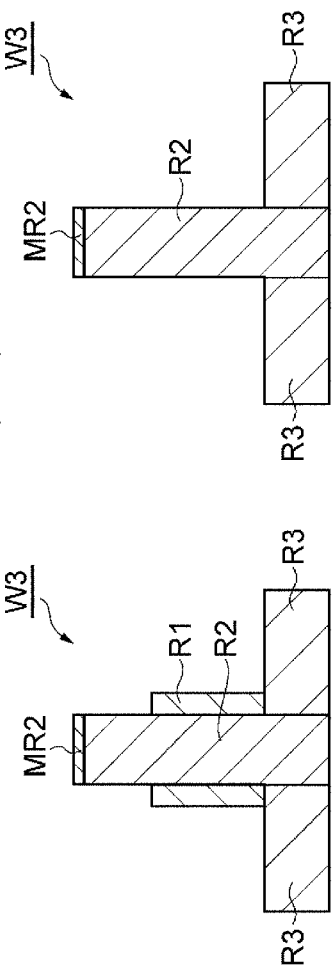

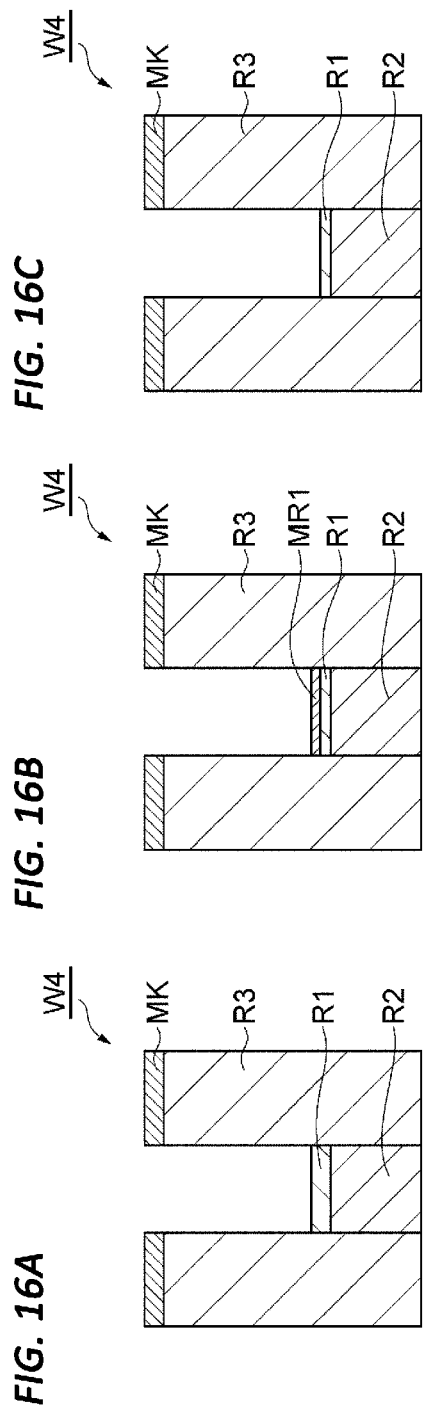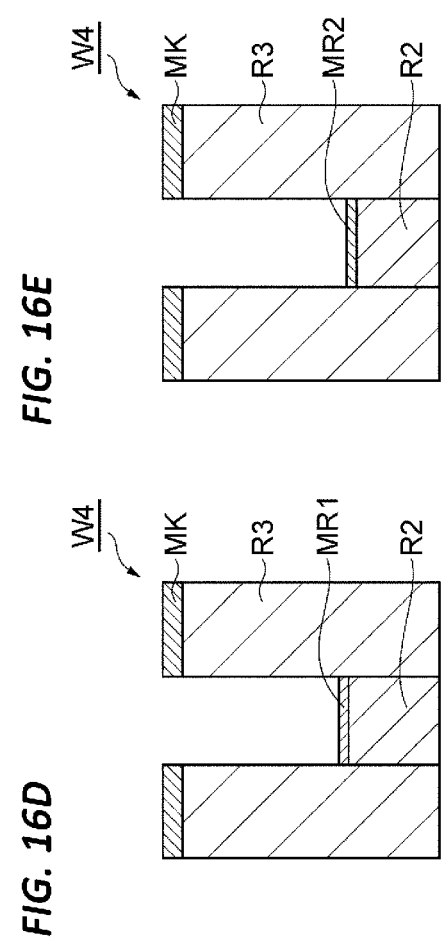

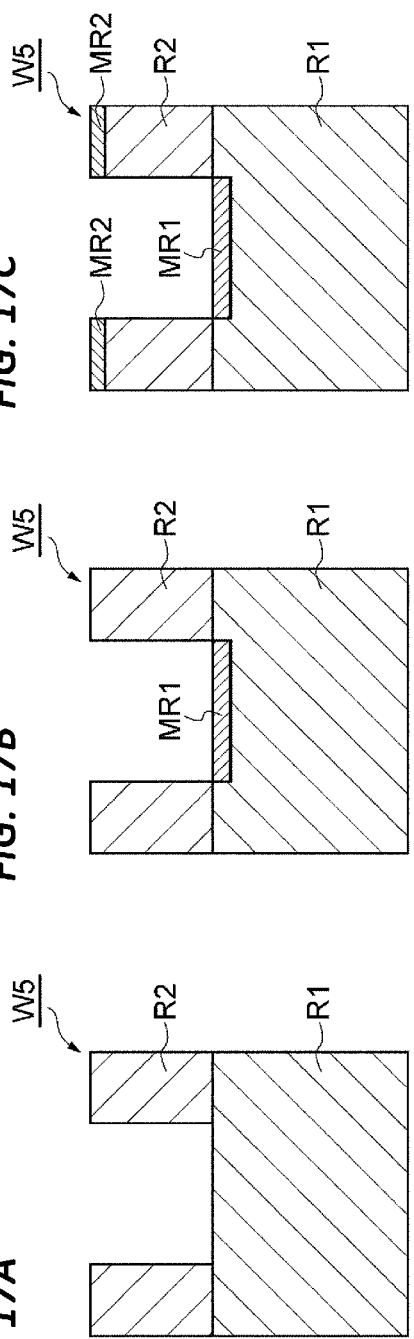

ETCHING METHOD AND PLASMA PROCESSING APPARATUS

CROSS-REFERENCE TO RELATED APPLICATIONS

This application is based on and claims priority from Japanese Patent Application No. 2018-025968 filed on Feb. 16, 2018 with the Japan Patent Office, the disclosure of which is incorporated herein in its entirety by reference.

TECHNICAL FIELD

An exemplary embodiment of the present disclosure relates to an etching method and a plasma processing apparatus.

BACKGROUND

In the manufacture of electronic devices, it may be required to selectively etch one region, among two regions each formed of different materials, with respect to the other region. For example, a first region, among two regions, is formed of silicon nitride, and a second region, among the two regions, is formed of silicon oxide.

In order to selectively etch the first region, formed of silicon nitride, with respect to the second region formed of silicon oxide, plasma etching using a hydrofluorocarbon gas is generally performed. In the plasma etching using the hydrofluorocarbon gas, the first region is etched by an active species in the plasma while the second region is protected by a deposit of fluorocarbon. Such plasma etching is described in Japanese Laid-Open Patent Publication No. 2003-229418.

SUMMARY

In a first aspect, a method of etching a substrate is provided. The substrate includes a first region and a second region. The first region includes silicon and nitrogen. The second region includes silicon and/or germanium. This method includes (i) modifying at least a portion of the first region, which includes a surface of the first region, using hydrogen plasma, to form a first modified region from the at least a portion of the first region, (ii) modifying at least a portion of a second region, which includes a surface of the second region, using oxygen plasma, to form a second modified region from the at least a portion of the second region, and (iii) selectively etching the first modified region with respect to the second modified region using fluorine plasma.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 15A is a partially enlarged cross-sectional view of a workpiece of a third example, FIG. 15B is a partially enlarged cross-sectional view of the workpiece of the third example after execution of step ST1, FIG. 15C is a partially enlarged cross-sectional view of the workpiece of the third example after execution of step ST3, FIG. 15D is a partially enlarged cross-sectional view of the workpiece of the third example after execution of step ST2 and step ST3, and FIG. 15E is a partially enlarged cross-sectional view of the workpiece of the third example after further execution of step ST3.

FIG. 16A is a partially enlarged cross-sectional view of a workpiece of a fourth example, FIG. 16B is a partially enlarged cross-sectional view of the workpiece of the fourth example after execution of step ST1 and step ST2, FIG. 16C is a partially enlarged cross-sectional view of the workpiece of the fourth example after execution of step ST3, FIG. 16D is a partially enlarged cross-sectional view of the workpiece of the fourth example after further execution of step ST1, and FIG. 16E is a partially enlarged cross-sectional view of the workpiece of the fourth example after the execution of step ST2 and step ST3.

FIG. 17A is a partially enlarged cross-sectional view of a workpiece of a fifth example, FIG. 17B is a partially enlarged cross-sectional view of the workpiece of the fifth example after execution of step ST1, FIG. 17C is a partially enlarged cross-sectional view of the workpiece of the fifth example after execution of step ST1 and step ST2, FIG. 17D is a partially enlarged cross-sectional view of the workpiece of the fifth example after execution of step ST3, and FIG. 17E is a partially enlarged cross-sectional view of the workpiece of the fifth example after execution of step ST3.

DESCRIPTION OF EMBODIMENT

Figure 1:
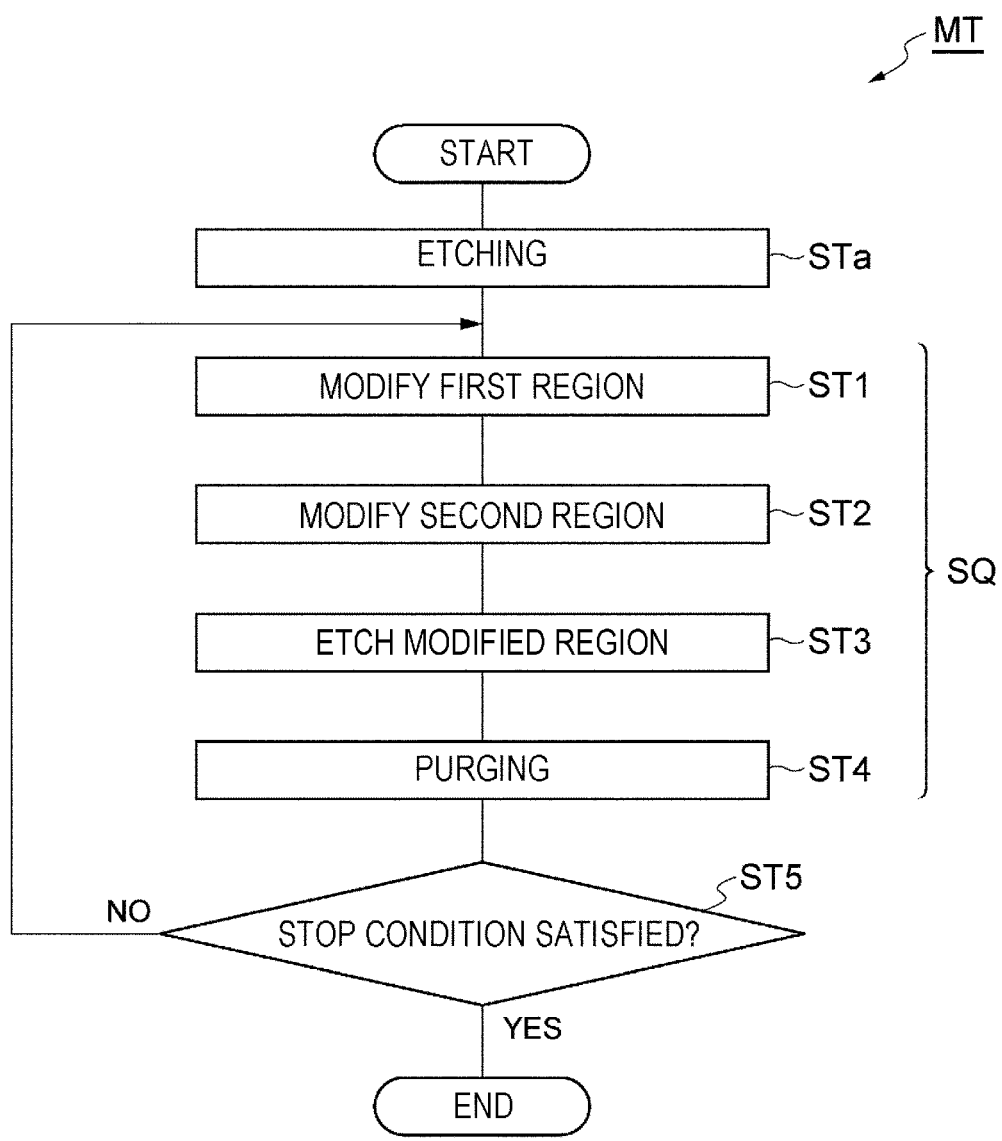
FIG. 1 is a flowchart illustrating a method according to an embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The second region may be formed of a material, other than silicon oxide, in some cases. Therefore, it is required to selectively etch the second region, which is formed of a material different from the material of the first region.

In a first aspect, a method of etching a substrate is provided. The substrate includes a first region and a second region. The first region includes silicon and nitrogen. The second region includes silicon and/or germanium. This method includes (i) modifying at least a portion of the first region, which includes a surface of the first region, using hydrogen plasma, to form a first modified region from the at least a portion of the first region, (ii) modifying at least a portion of a second region, which includes a surface of the second region, using oxygen plasma, to form a second modified region from the at least a portion of the second region, and (iii) selectively etching the first modified region with respect to the second modified region using fluorine plasma.

In the method according to the first aspect, the at least a portion of the first region is modified with an active species of hydrogen so as to form the first modified region. The first modified region is more easily etched by an active species of fluorine than the first region. In addition, the at least a portion of the second region is modified by an active species of oxygen so as to form the second modified region. The second modified region is more difficult to be etched by the active species of fluorine than the second region. Thus, the first modified region is selectively etched with respect to the second modified region by the active species of fluorine. That is, according to this method, the first region is selectively etched with respect to the second region. In addition, the active species in the plasma used in this method have considerably low deposition ability, or have substantially no deposition ability. Thus, according to this method, generation of a deposit on the substrate is prevented.

In an embodiment, the modifying the at least a portion of the second region is executed in parallel with at least one of the modifying the at least a portion of the first region and the selectively etching the first modified region.

In an embodiment, a sequence, which includes the modifying the at least a portion of the first region, the modifying the at least a portion of the second region, and the selectively etching the first modified region, is repeated.

In the method of an exemplary embodiment, in the repetition of the sequence, at least one of an execution time length of the modifying the at least a portion of the first region, an execution time length of the modifying the at least a portion of the second region, or an execution time length of the selectively etching the first modified region may be changed.

In an embodiment, the sequence may be executed for a period that includes a time point at which the second region is exposed.

In an embodiment, the modifying the at least a portion of the first region, the modifying the at least a portion of the second region, and the selectively etching the first modified region are executed in a state where the substrate is placed on a support table provided in a chamber of a plasma processing apparatus. The sequence further includes purging an inner space in the chamber after the selectively etching the first modified region.

In an embodiment of the purging, a hydrogen-containing gas is supplied to the inner space. In an embodiment, the hydrogen-containing gas is continuously supplied to the inner space of the chamber while the sequence is executed. In the purging of an embodiment, no plasma is generated.

In an embodiment, the modifying the at least a portion of the first region and the selectively etching the first modified region are executed in a state where the substrate is placed on the support table provided in the chamber of the plasma processing apparatus. The support table includes a lower electrode, to which a high frequency bias power is supplied in order to introduce ions into the substrate. The high frequency bias power in the modifying the at least a portion of the first region is greater than the high frequency bias power in the selectively etching the first modified region. In an embodiment, hydrogen plasma may also be generated in the selectively etching the first modified region.

In an embodiment, a selectivity, which is a ratio of an etching rate of the first region to an etching rate of the second region, is equal to or greater than 10. That is, in the selectively etching the first modified region, an etching rate of the first modified region is 10 times or more than an etching rate of the second modified region.

In a second aspect, a method of selectively etching a first region of a substrate with respect to a second region of the substrate is provided. The first region includes silicon and nitrogen in a preferred example. The second region includes a metal in a preferred example. This method includes (i) modifying at least a portion of the first region, which includes a surface of the first region, using hydrogen plasma, to form a modified region from the at least a portion of the first region, and (ii) selectively etching the modified region using fluorine plasma.

In the method according to the second aspect, the at least a portion of the first region is modified by an active species of hydrogen so as to form the modified region. The modified region is more easily etched by an active species of fluorine than the first region. On the other hand, the second region is hardly modified by the active species of hydrogen. Thus, the modified region is selectively etched with respect to the second region by the active species of fluorine. That is, according to this method, the first region is selectively etched with respect to the second region. In addition, the active species in the plasma used in this method have considerably low deposition ability, or have substantially no deposition ability. Thus, according to this method, generation of a deposit on the substrate is prevented.

In an embodiment, the method further includes modifying at least a portion of the second region, which includes a surface of the second region, using oxygen plasma. In the selectively etching the modified region, the modified region is selectively etched with respect to at least a part of the modified portion of the second region.

In a third aspect, a plasma processing apparatus for etching a substrate is provided. The substrate includes a first region and a second region. The first region includes silicon and nitrogen. The second region includes silicon and/or germanium. The plasma processing apparatus includes a chamber, a support table, a gas supply unit, a plasma generation unit, and a controller. The chamber provides an inner space. The support table is configured to support the substrate in the inner space. The gas supply unit is configured to supply a gas to the inner space of the chamber. The plasma generation unit is configured to excite the gas in the inner space of the chamber so as to generate plasma. The controller is configured to control the gas supply unit and the plasma generation unit. The controller (i) controls the gas supply unit and the plasma generation unit so as to generate plasma of a hydrogen-containing gas in the inner space of the chamber in order to form a first modified region by modifying at least a portion of the first region, which includes a surface of the first region, using hydrogen plasma, (ii) controls the gas supply unit and the plasma generation unit so as to generate plasma of an oxygen-containing gas in the inner space of the chamber in order to form a second modified region by modifying at least a portion of the second region, which includes a surface of the second region, using oxygen plasma, and (iii) controls the gas supply unit and the plasma generation unit so as to generate plasma of a fluorine-containing gas in the inner space of the chamber in order to selectively etch the first modified region with respect to the second modified region using fluorine plasma.

In a fourth aspect, a plasma processing apparatus for etching a substrate is provided. The substrate includes a first region and a second region. The first region includes silicon and nitrogen. The second region includes a metal. The plasma processing apparatus includes a chamber, a support table, a gas supply unit, a plasma generation unit, and a controller. The chamber provides an inner space. The support table is configured to support the substrate in the inner space. The gas supply unit is configured to supply a gas to the inner space. The plasma generation unit is configured to excite the gas in the inner space so as to generate plasma. The controller is configured to control the gas supply unit and the plasma generation unit. The controller (i) controls the gas supply unit and the plasma generation unit so as to generate plasma of a fluorine-containing gas in the inner space of the chamber in order to form a modified region by modifying at least a portion of the first region, which includes a surface of the first region, using hydrogen plasma, and (ii) controls the gas supply unit and the plasma generation unit so as to generate plasma of a hydrogen-containing gas in the inner space of the chamber in order to selectively etch the modified region using fluorine plasma.

In a fifth aspect, a method of etching a substrate is provided. The substrate includes a first region and a second region. The method includes (i) modifying at least a portion of the first region, which includes a surface of the first region, using a first plasma, to form a first modified region from the at least a portion of the first region, (ii) modifying the at least a portion of the second region, which includes a surface of the second region, using second plasma, to form a second modified region from the at least a portion of the second region, and (iii) selectively etching the first modified region with respect to the second modified region using third plasma. The first plasma modifies the at least a portion of the first region so as to increase an etching rate of the first modified region by the third plasma as compared to an etching rate of the first region by the third plasma. The second plasma modifies the at least a portion of the second region so as to reduce an etching rate of the second modified region by the third plasma as compared to an etching rate of the second region by the third plasma.

In a sixth aspect, a plasma processing apparatus for etching a substrate is provided. The substrate includes a first region and a second region. The plasma processing apparatus includes a chamber, a support table, a gas supply unit, a plasma generation unit, and a controller. The chamber provides an inner space. The support table is configured to support the substrate in the inner space. The gas supply unit is configured to supply a gas to the inner space. The plasma generation unit is configured to excite the gas in the inner space so as to generate plasma. The controller is configured to control the gas supply unit and the plasma generation unit. The controller (i) controls the gas supply unit and the plasma generation unit so as to generate first plasma in the inner space of the chamber in order to form a first modified region by modifying at least a portion of the first region, which includes a surface of the first region, using the first plasma, (ii) controls the gas supply unit and the plasma generation unit so as to generate second plasma in the inner space of the chamber in order to form a second modified region by modifying at least a portion of the second region, which includes a surface of the second region, using the second plasma, and (iii) controls the gas supply unit and the plasma generation unit so as to generate third plasma in the inner space of the chamber in order to selectively etch the first modified region with respect to the second modified region using the third plasma. The first plasma modifies the at least a portion of the first region so as to increase an etching rate of the first modified region by the third plasma as compared to an etching rate of the first region by the third plasma. The second plasma modifies the at least a portion of the second region so as to reduce an etching rate of the second modified region by the third plasma as compared to an etching rate of the second region by the third plasma.

As described above, it is possible to selectively etch a first region of a substrate with respect to a second region, which is formed of a material different from the material of the first region.

Hereinafter, embodiments will be described in detail with reference to the accompanying drawings. In addition, in the respective drawings, the same reference numerals will be attached to the same or corresponding parts.

Figure 2A:
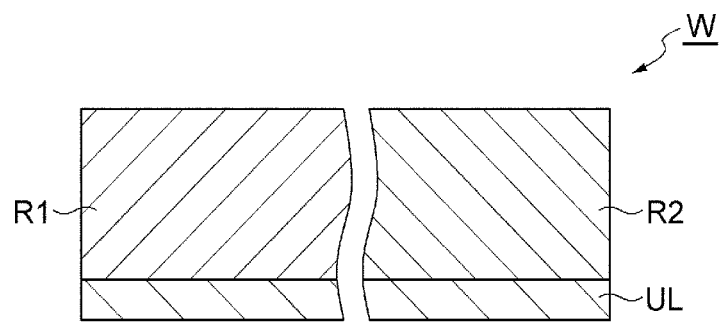
FIG. 2A is a partially enlarged cross-sectional view of an exemplary workpiece, to which the method illustrated in FIG. 1 may be applied.
Figure 3A:
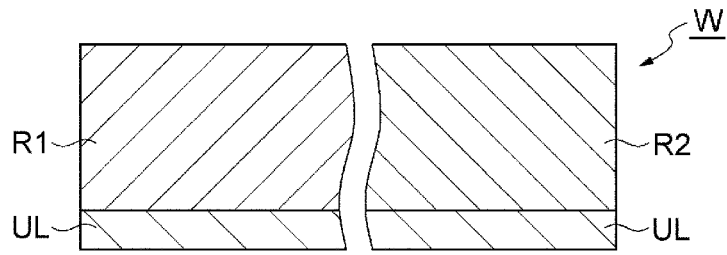
FIG. 3A is a partially enlarged cross-sectional view of an exemplary workpiece, to which the method illustrated in FIG. 1 may be applied.
Figure 4A:
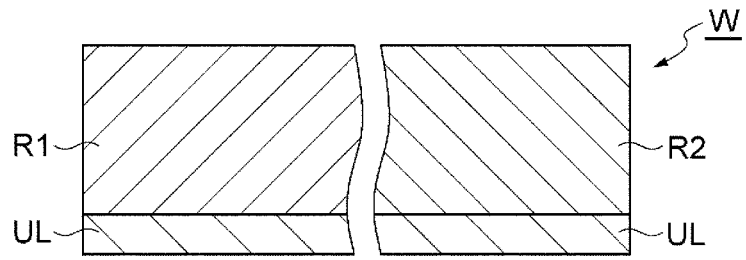
FIG. 4A is a partially enlarged cross-sectional view of an exemplary workpiece, to which the method illustrated in FIG. 1 may be applied.

FIG. 1 is a flowchart illustrating a method according to an embodiment. Method MT illustrated in FIG. 1 is a method of selectively etching a first region of a workpiece (serving as a substrate) with respect to a second region of the workpiece. FIGS. 2A, 3A and 4A are partially enlarged cross-sectional views of an exemplary workpiece, to which the method according to the embodiment may be applied. The workpiece W illustrated in FIGS. 2A, 3A and 4A includes a first region R1 and a second region R2. The workpiece W has, for example, a substantially disk shape.

The first region R1 and the second region R2 are formed of different materials. As a first example, the first region R1 includes silicon and nitrogen, and the second region R2 includes silicon and/or germanium. In the first example, the first region R1 is formed of, for example, silicon nitride, silicon oxynitride, or silicon carbonitride. In the first example, the second region R2 is formed of, for example, silicon, germanium, or silicon germanium.

As a second example, the first region R1 includes silicon and nitrogen, and the second region R2 includes a metal. In the second example, the first region R1 is formed of, for example, silicon nitride, silicon oxynitride, or silicon carbonitride. In the second example, the second region R2 is formed of, for example, titanium, titanium nitride, titanium oxide, tungsten, tungsten carbide, ruthenium, hafnium, hafnium oxide, zirconium, zirconium oxide, or tantalum. In addition, the material of the first region R1 and the material of the second region R2 are not limited as long as they are different from each other.

Figure 8:
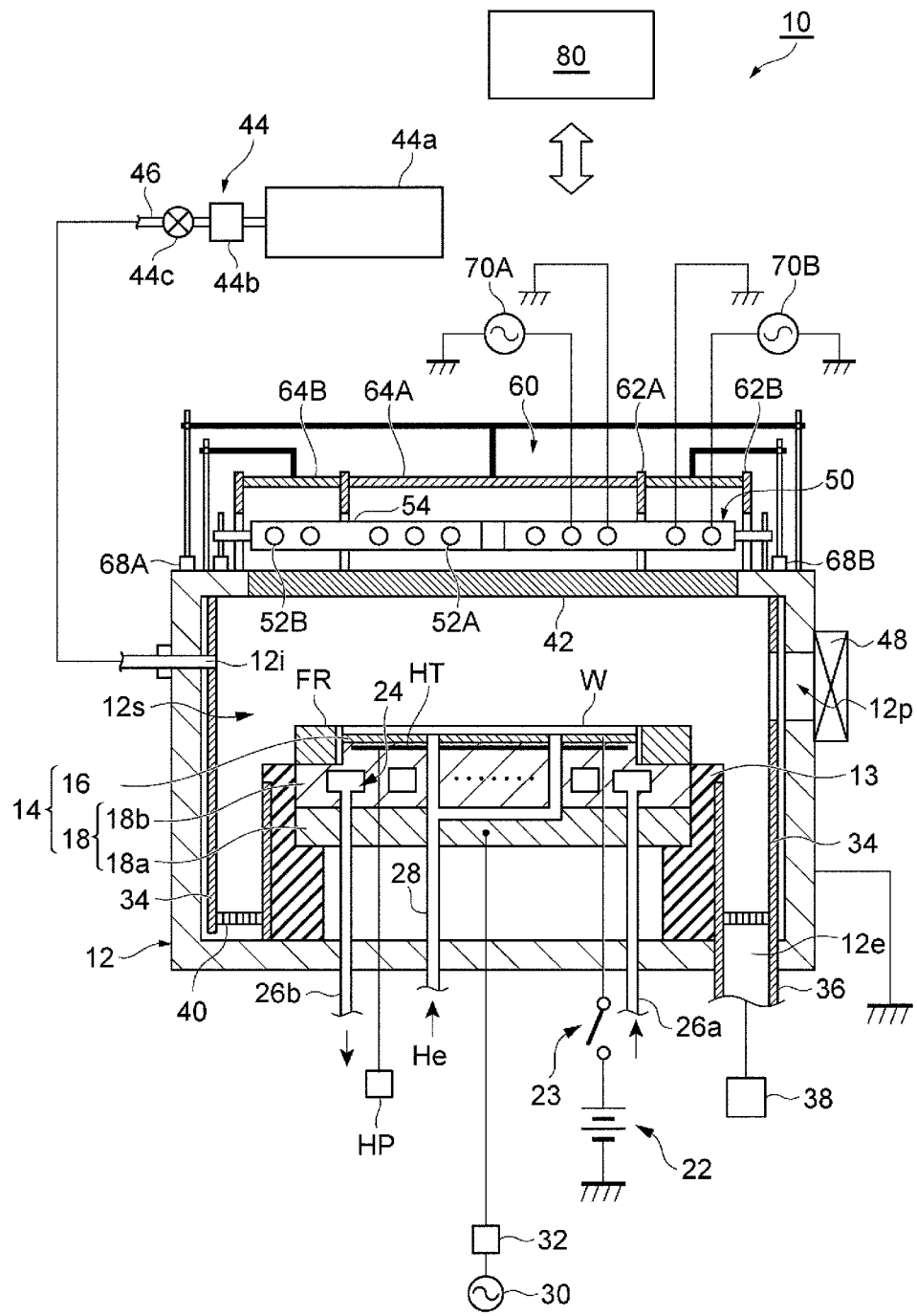
FIG. 8 is a view schematically illustrating a plasma processing apparatus according to an embodiment.

In method MT, a plasma processing apparatus is used. FIG. 8 is a view schematically illustrating a plasma processing apparatus according to an embodiment. The plasma processing apparatus 10 illustrated in FIG. 8 may be used to selectively etch the first region of the workpiece W with respect to the second region. The plasma processing apparatus 10 includes an inductively coupled plasma (ICP) type plasma generation unit in the illustrated example, however other plasma generation arrangement could be used.

The plasma processing apparatus 10 includes a chamber 12. The chamber 12 is formed of a metal such as aluminum, for example. The chamber 12 has, for example, a substantially cylindrical shape. The chamber 12 provides an inner space 12s therein.

A support table 14 is provided in the inner space 12s. The support table 14 is configured to hold the workpiece W mounted thereon. The support table 14 may be supported by a support unit 13. The support unit 13 is provided in the inner space 12s, and extends upward from the bottom portion of the chamber 12. The support unit 13 has, for example, a substantially cylindrical shape. The support unit 13 is formed of an insulation material such as quartz.

The support table 14 includes an electrostatic chuck 16 and a lower electrode 18. The lower electrode 18 includes a first plate 18a and a second plate 18b. The first plate 18a and the second plate 18b are formed of a metal such as aluminum, for example. The first plate 18a and the second plate 18b have, for example, a substantially disc shape. The second plate 18b is provided on the first plate 18a. The second plate 18b is electrically connected to the first plate 18a.

The electrostatic chuck 16 is provided on the second plate 18b. The electrostatic chuck 16 includes a body and an electrode. The body of the electrostatic chuck 16 is formed of a dielectric material or an insulator. The electrode of the electrostatic chuck 16 is a film having conductivity, and is provided in the body. A DC power supply 22 is electrically connected to the electrode of the electrostatic chuck 16 via a switch 23. When a DC voltage is applied from the DC power supply 22 to the electrode of the electrostatic chuck 16, an electrostatic attractive force is generated between the workpiece W and the electrostatic chuck 16. The workpiece W is attracted to the electrostatic chuck 16 and held by the electrostatic chuck 16 by the electrostatic attractive force.

When the plasma processing apparatus 10 is used, a focus ring FR is disposed on the peripheral portion of the second plate 18b so as to surround the edge of the workpiece W and the edge of the electrostatic chuck 16. The focus ring FR is used to improve the uniformity of a plasma processing. The focus ring FR is formed of quartz, for example.

A flow path 24 is formed in the second plate 18b. A heat exchange medium (e.g., a coolant) is supplied to the flow path 24 from a feeder (e.g., a chiller unit) provided outside the chamber 12, in order to adjust the temperature of the support table 14. The feeder may have a function of adjusting the temperature of the heat exchange medium. The heat exchange medium is supplied from the feeder to the flow path 24 through a pipe 26a. The heat exchange medium supplied to the flow path 24 is returned to the feeder through a pipe 26b. The heat exchange medium supplied to the flow path 24 adjusts the temperature of the workpiece W placed on the electrostatic chuck 16 by passing through the support table 14.

In the plasma processing apparatus 10, a gas supply line 28 extends through the support table 14 to the upper surface of the electrostatic chuck 16. A heat transfer gas, for example, He gas from a heat transfer gas supply mechanism is supplied to a space between the upper surface of the electrostatic chuck 16 and the back surface of the workpiece W through the gas supply line 28. The heat transfer gas promotes heat exchange between the support table 14 and the workpiece W.

A heater HT may be provided in the support table 14. The heater HT is, for example, a resistance heating element. The heater HT is embedded in the second plate 18b or in the electrostatic chuck 16. The heater HT is connected to a heater power supply HP. When power is supplied from the heater power supply HP to the heater HT, the temperature of the support table 14 is adjusted, and in turn the temperature of the workpiece W is adjusted.

A high frequency power supply 30 is connected to the lower electrode 18 of the support table 14 via a matcher 32. A high frequency bias power is supplied from the high frequency power supply 30 to the lower electrode 18. The high frequency bias power has a frequency suitable for introducing ions into the workpiece W mounted on the support table 14. The frequency of the high frequency bias power is, for example, a frequency within the range from 400 kHz to 40.68 MHz, and in one example, is a frequency of 13.56 MHz. The matcher 32 includes a circuit for matching the output impedance of the high frequency power supply 30 with the impedance of the load side (the lower electrode 18 side). In addition, in the plasma processing apparatus 10, by supplying the high frequency bias power to the lower electrode 18, it is also possible to generate plasma without using any other high frequency power for plasma generation. That is, the high frequency power supply 30 may constitute a plasma generation unit of an embodiment.

In the plasma processing apparatus 10, a shield 34 is detachably provided along the inner wall of the chamber 12. The shield 34 is also provided on the outer periphery of the support unit 13. The shield 34 is a member for preventing etching byproducts from adhering to the chamber 12. The shield 34 may be configured by coating the surface of an aluminum base material with ceramic such as $Y_2O_3$.

An exhaust path is formed between the support table 14 and the sidewall of the chamber 12. The exhaust path is connected to an exhaust port 12e formed in the bottom portion of the chamber 12. An exhaust device 38 is connected to the exhaust port 12e via a pipe 36. The exhaust device 38 includes a pressure regulator and a vacuum pump. The pressure regulator is, for example, an automatic pressure control valve. The vacuum pump may include one or more depression pumps, such as a turbo molecular pump and a dry pump. A baffle plate 40 is provided in the exhaust path, that is, between the support table 14 and the sidewall of the chamber 12. The baffle plate 40 has multiple through-holes formed therein in a plate thickness direction thereof. The baffle plate 40 may be configured, for example, by coating the surface of an aluminum base material with a ceramic such as $Y_2O_3$.

The upper portion of the chamber 12 is open. An opening in the upper portion of the chamber 12 is closed by a window member 42. The window member 42 is formed of a dielectric material such as quartz. The window member 42 has, for example, a plate shape. As an example, a distance between the lower surface of the window member 42 and the upper surface of the workpiece W placed on the electrostatic chuck 16 is set to a range from 120 mm to 180 mm.

A gas introduction port 12i is formed in the sidewall of the chamber 12. A gas supply unit 44 is connected to the gas introduction port 12i via a pipe 46. The gas supply unit 44 supplies multiple gases used in method MT to the inner space 12s. The gas supply unit 44 includes a gas source group 44a, a flow rate controller group 44b, and a valve group 44c. The gas source group 44a includes multiple gas sources. The multiple gas sources include sources of the multiple gases used in method MT. The flow rate controller group 44b includes multiple flow rate controllers. Each of the multiple flow rate controllers is a mass flow controller or a pressure control type flow rate controller. The valve group 44c includes multiple valves. Each of the multiple gas sources of the gas source group 44a is connected to the gas introduction port 12i through a corresponding one of the multiple flow rate controllers of the flow rate controller group 44b and a corresponding one of the multiple valves of the valve group 44c. In addition, the gas introduction port 12i may be formed in any other location, such as the window member 42, instead of the sidewall of the chamber 12.

An opening 12p is formed in the sidewall of the chamber 12. When the workpiece W is transferred between the inner space 12s and the outside of the chamber 12, the workpiece W passes through the opening 12p. The opening 12p may be opened and closed by a gate valve 48. The gate valve 48 is provided along the sidewall of the chamber 12.

An antenna 50 and a shield member 60 are provided above the upper portion of the chamber 12 and above the window member 42. The antenna 50 and the shield member 60 are provided outside the chamber 12. In the embodiment, the antenna 50 includes an inner antenna element 52A and an outer antenna element 52B. The inner antenna element 52A is a spiral coil, and extends on the central portion of the window member 42. The outer antenna element 52B is a spiral coil, and extends on the window member 42 and outside the inner antenna element 52A. Each of the inner antenna element 52A and the outer antenna element 52B is formed of a conductor such as copper, aluminum, or stainless steel.

Both of the inner antenna element 52A and the outer antenna element 52B are fitted into multiple holding members 54 and are supported by the multiple holding members 54. Each of the multiple holding members 54 has a rod shape. The multiple holding members 54 extend radially from the vicinity of the center of the inner antenna element 52A to the outside of the outer antenna element 52B.

The shield member 60 covers the antenna 50. The shield member 60 includes an inner shield wall 62A and an outer shield wall 62B. The inner shield wall 62A has a cylindrical shape. The inner shield wall 62A is provided between the inner antenna element 52A and the outer antenna element 52B so as to surround the inner antenna element 52A. The outer shield wall 62B has a cylindrical shape. The outer shield wall 62B is provided outside the outer antenna element 52B so as to surround the outer antenna element 52B.

An inner shield plate 64A having a disc shape is provided on the inner antenna element 52A so as to close an opening in the inner shield wall 62A. An outer shield plate 64B having an annular plate shape is provided on the outer antenna element 52B so as to close an opening between the inner shield wall 62A and the outer shield wall 62B.

The shapes of the shield wall and the shield plate of the shield member 60 are not limited to the above-described shapes. The shield wall of the shield member 60 may have any other shape such as a square tubular shape.

The inner antenna element 52A and the outer antenna element 52B are connected respectively to a high frequency power supply 70A and a high frequency power supply 70B. The high frequency power supply 70A and the high frequency power supply 70B supply high frequency source power having the same frequency or different frequencies to the inner antenna element 52A and the outer antenna element 52B, respectively. When the high frequency source power is supplied from the high frequency power supply 70A to the inner antenna element 52A, an induction magnetic field is generated in the inner space 12s, so that the gas in the inner space 12s is excited by the induction magnetic field. Thereby, plasma is generated above the central region of the workpiece W. When the high frequency source power is supplied from the high frequency power supply 70B to the outer antenna element 52B, an induction magnetic field is generated in the inner space 12s, so that the gas in the inner space 12s is excited by the induction magnetic field. Thereby, annular plasma is generated above the edge region of the workpiece W. That is, the high frequency power supplies 70A and 70B may constitute a plasma generation unit of an embodiment.

In addition, it is necessary to adjust the electrical lengths of the inner antenna element 52A and the outer antenna element 52B according to the high frequency source power output from each of the high frequency power supply 70A and the high frequency power supply 70B. Therefore, the position in the height direction of each of the inner shield plate 64A and the outer shield plate 64B is individually adjusted by an actuator 68A or an actuator 68B.

The plasma processing apparatus 10 may further include a controller 80. The controller 80 may be a computer including a processor, a storage unit such as a memory, an input device, and a display device, for example. The controller 80 operates according to a control program and recipe data stored in the storage unit, so as to control various elements of the plasma processing apparatus 10. Specifically, the controller 80 controls various elements of the plasma processing apparatus, such as the multiple flow rate controllers of the flow rate controller group 44b, the multiple valves of the valve group 44c, the exhaust device 38, the high frequency power supply 70A, the high frequency power supply 70B, the high frequency power supply 30, the matcher 32, and the heater power supply HP. The controller 80 may execute method MT by controlling various elements of the plasma processing apparatus 10 according to the control program and the recipe data.

Figure 2B:
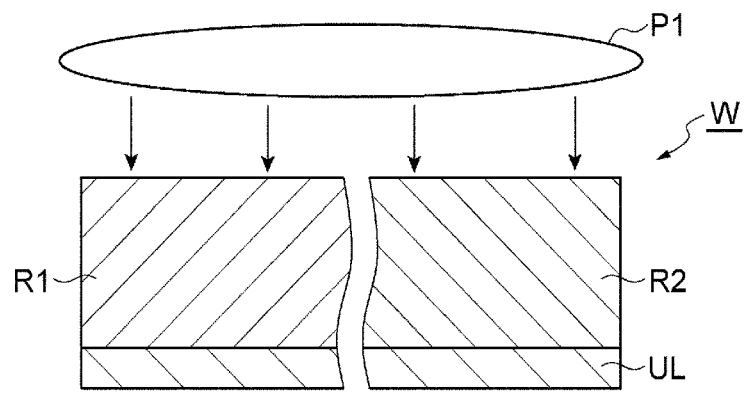
FIG. 2B is a view for explaining step ST1 of the method illustrated in FIG. 1.
Figure 2C:
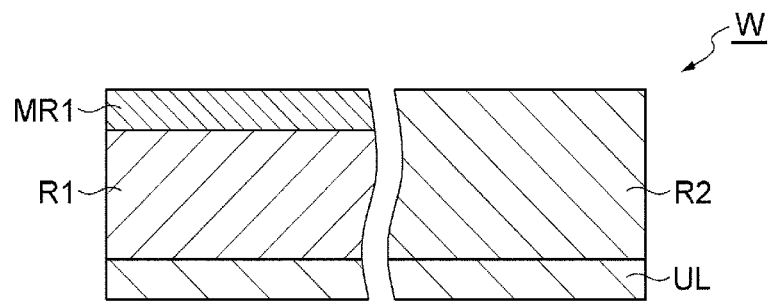
FIG. 2C is a partially enlarged cross-sectional view of the exemplary workpiece after execution of step ST1 of the method illustrated in FIG. 1.
Figure 3B:
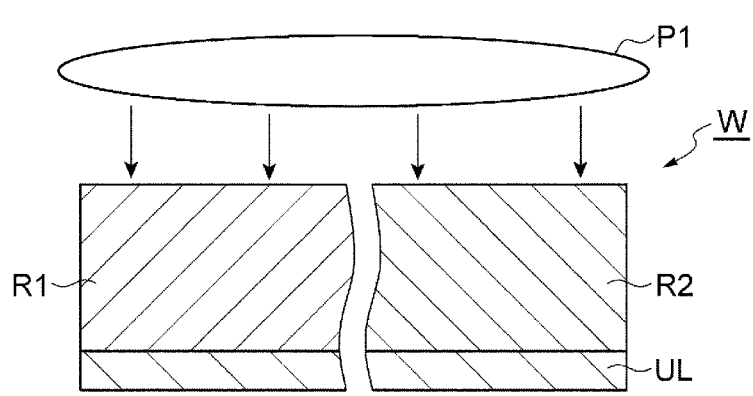
FIG. 3B is a view for explaining step ST1 of the method illustrated in FIG. 1.
Figure 3C:
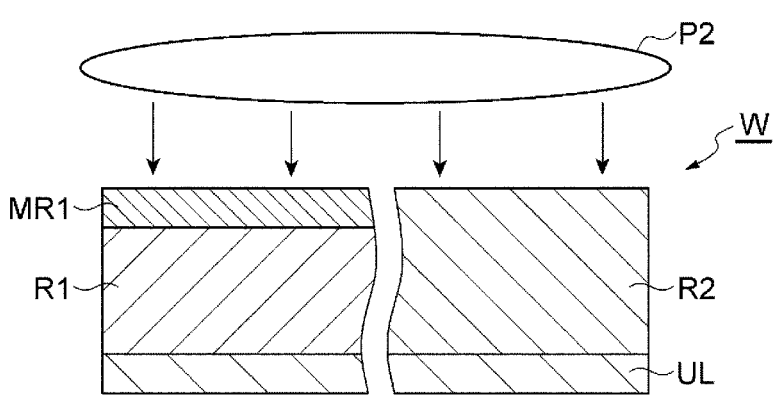
FIG. 3C is a view for explaining step ST2 of the method illustrated in FIG. 1.
Figure 3D:
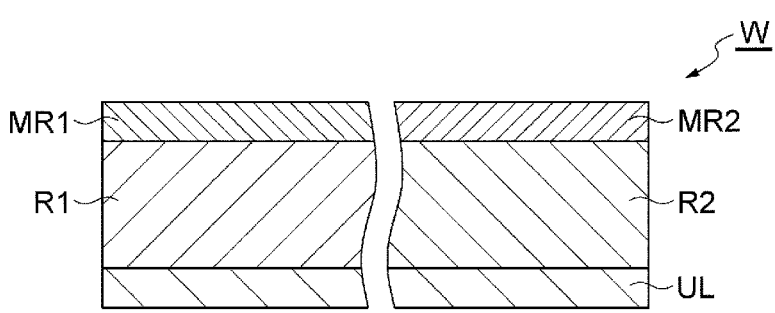
FIG. 3D is a partially enlarged cross-sectional view of the exemplary workpiece after execution of step ST1 and step ST2 of the method illustrated in FIG. 1.
Figure 4B:
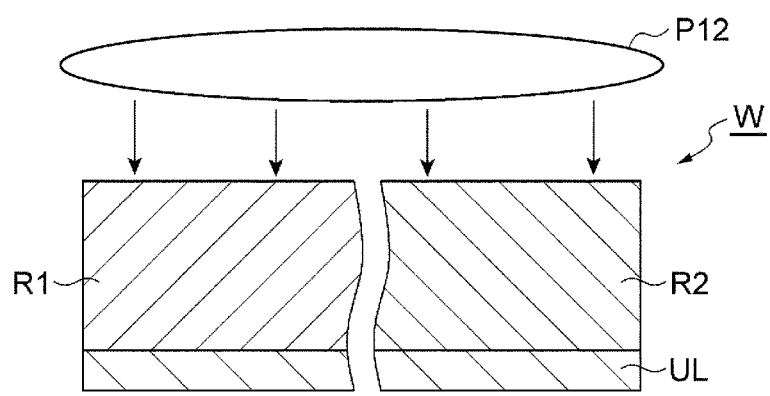
FIG. 4B is a view for explaining step ST1 and step ST2 of the method illustrated in FIG. 1.
Figure 4C:
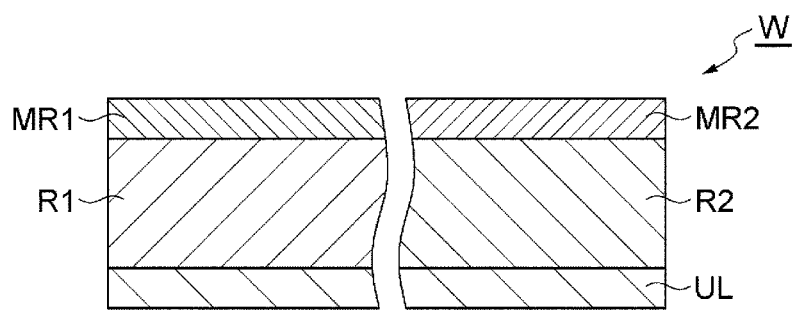
FIG. 4C is a partially enlarged cross-sectional view of the exemplary workpiece after execution of step ST1 and step ST2 of the method illustrated in FIG. 1.
Figure 5A:
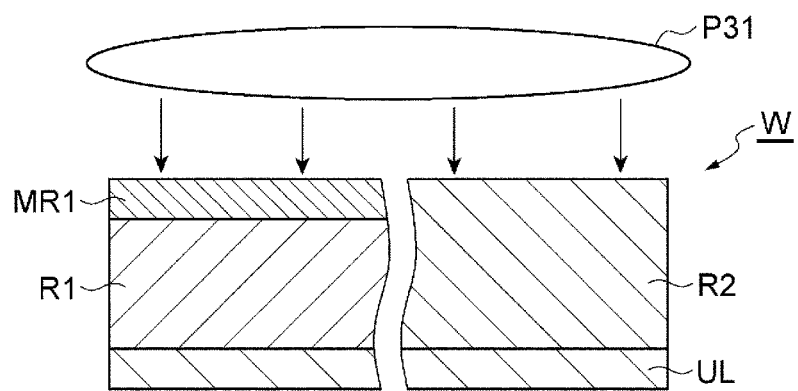
FIG. 5A is a view for explaining step ST3 of the method illustrated in FIG. 1.
Figure 5B:
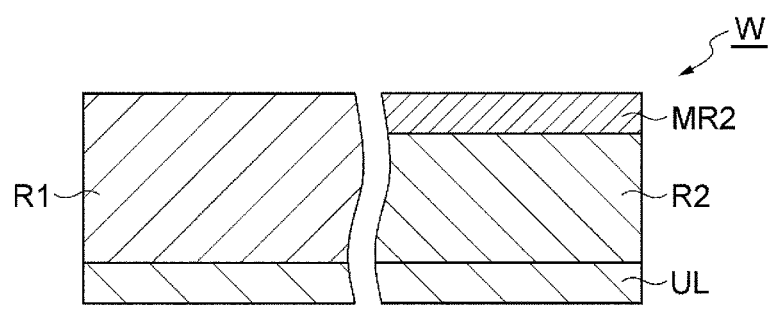
FIG. 5B is a partially enlarged cross-sectional view of an exemplary workpiece after execution of step ST3 of the method illustrated in FIG. 1.
Figure 5C:
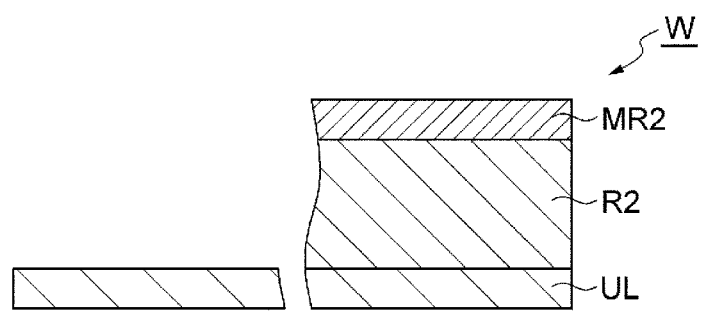
FIG. 5C is a partially enlarged cross-sectional view of the exemplary workpiece after execution of the method illustrated in FIG. 1.
Figure 6A:
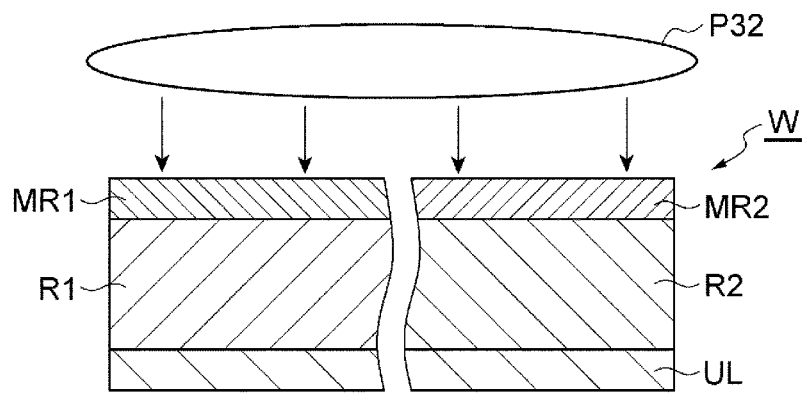
FIG. 6A is a view for explaining step ST3 of the method illustrated in FIG. 1.
Figure 6B:
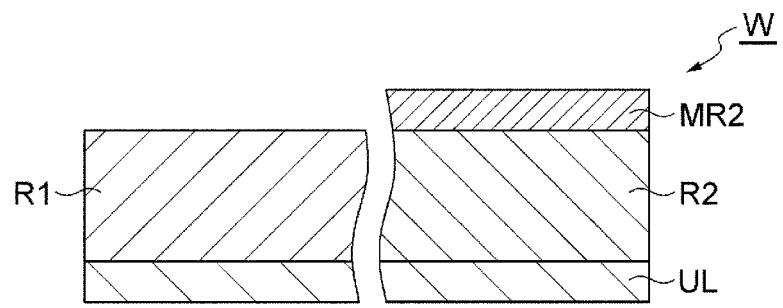
FIG. 6B is a partially enlarged cross-sectional view of an exemplary workpiece after execution of step ST3 of the method illustrated in FIG. 1.
Figure 6C:
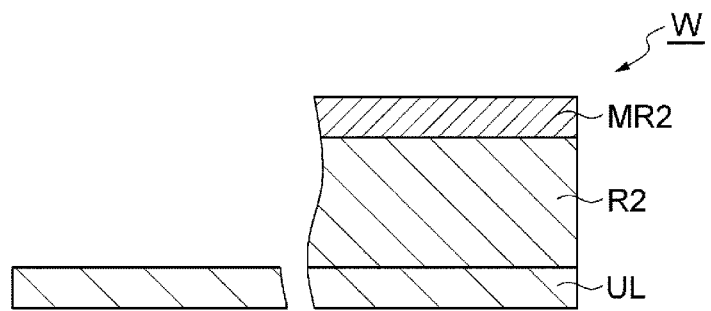
FIG. 6C is a partially enlarged cross-sectional view of the exemplary workpiece after execution of the method illustrated in FIG. 1.
Figure 7A:
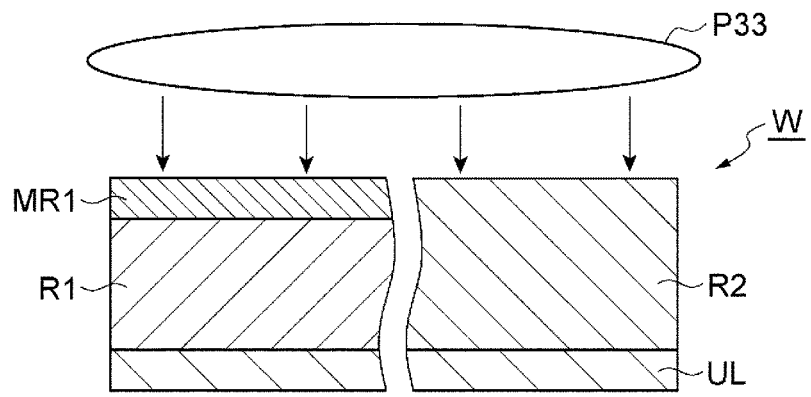
FIG. 7A is a view for explaining step ST3 of the method illustrated in FIG. 1.
Figure 7B:
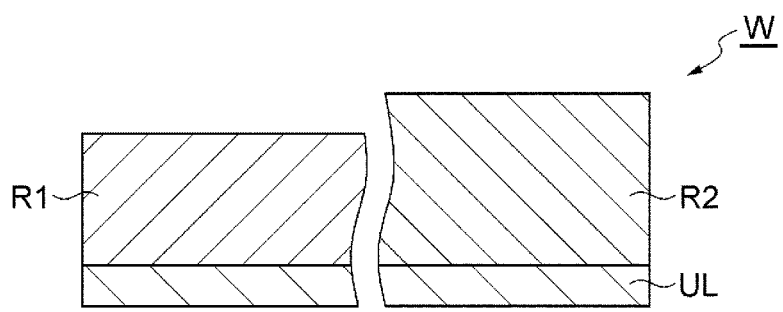
FIG. 7B is a partially enlarged cross-sectional view of an exemplary workpiece after execution of step ST3 of the method illustrated in FIG. 1.
Figure 7C:
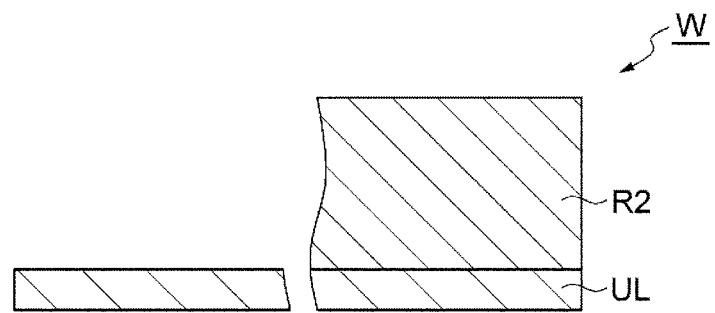
FIG. 7C is a partially enlarged cross-sectional view of the exemplary workpiece after execution of the method illustrated in FIG. 1.

Hereinafter, referring again to FIG. 1, method MT will be described by taking as an example a case where the plasma processing apparatus 10 is used. In addition, in the following description, reference will be made to FIGS. 2A, 2B, 2C, 3A, 3B, 3C, 3D, 4A, 4B, 4C, 5A, 5B, 5C, 6A, 6B, 6C, 7A, 7B and 7C. FIG. 2B is a view for explaining step ST1 of the method illustrated in FIG. 1, and FIG. 2C is a partially enlarged cross-sectional view of an exemplary workpiece after execution of step ST1 of the method illustrated in FIG. 1. FIG. 3B is a view for explaining step ST1 of the method illustrated in FIG. 1, FIG. 3C is a view for explaining step ST2 of the method illustrated in FIG. 1, and FIG. 3D is a partially enlarged cross-sectional view of an exemplary workpiece after execution of step ST1 and step ST2 of the method illustrated in FIG. 1. FIG. 4B is a view for explaining step ST1 and step ST2 of the method illustrated in FIG. 1, and FIG. 4C is a partially enlarged cross-sectional view of an exemplary workpiece after execution of step ST1 and step ST2 of the method illustrated in FIG. 1. FIG. 5A is a view for explaining step ST3 of the method illustrated in FIG. 1, FIG. 5B is a partially enlarged cross-sectional view of an exemplary workpiece after execution of step ST3 of the method illustrated in FIG. 1, and FIG. 5C is a partially enlarged cross-sectional view of the exemplary workpiece after execution of the method illustrated in FIG. 1. FIG. 6A is a view for explaining step ST3 of the method illustrated in FIG. 1, FIG. 6B is a partially enlarged cross-sectional view of an exemplary workpiece after execution of step ST3 of the method illustrated in FIG. 1, and FIG. 6C is a partially enlarged cross-sectional view of the exemplary workpiece after execution of the method illustrated in FIG. 1. FIG. 7A is a view for explaining step ST3 of the method illustrated in FIG. 1, FIG. 7B is a partially enlarged cross-sectional view of an exemplary workpiece after execution of step ST3 of the method illustrated in FIG. 1, and FIG. 7C is a partially enlarged cross-sectional view of the exemplary workpiece after execution of the method illustrated in FIG. 1.

In addition, in the following description, reference will be made to FIGS. 9 to 14. Each of FIGS. 9 to 14 is a timing chart related to method MT. In each timing chart of FIGS. 9 to 14, the horizontal axis represents time. In each timing chart of FIGS. 9 to 14, high frequency source power indicates the high frequency source power supplied by the high frequency power supply 70A and the high frequency power supply 70B for the generation of plasma, and high frequency bias power indicates the high frequency bias power supplied from the high frequency power supply 30 to the lower electrode 18. In each timing chart of FIGS. 9 to 14, the fact that the flow rate of each gas is "0" indicates that the gas is not supplied to the inner space 12s, and the fact that the flow rate of each gas is greater than "0" indicates that the gas is supplied to the inner space 12s.

Method MT is executed in a state where the workpiece W is placed on the support table 14 and is held by the electrostatic chuck 16. Method MT includes step ST1 and step ST3. In an embodiment, method MT further includes step ST2. In method MT of the embodiment, a sequence SQ, which includes step ST1 and step ST3, or includes step ST1, step ST2, and step ST3, is executed once, or repeated. The sequence SQ is executed, for example, at least once and not more than 200 times.

Method MT may further include step STa. Step STa is executed before execution of the sequence SQ. For example, in a case where the first region R1 of the workpiece W is covered with another region, step STa is executed in order to expose the first region R1 by etching the other region. In a case where the other region is formed of silicon oxide, in step STa, the other region is etched by plasma of a fluorine-containing gas until the first region R1 is exposed. In step STa, the controller 80 controls the gas supply unit 44 so as to supply the fluorine-containing gas to the inner space 12s. In step STa, the controller 80 controls the exhaust device 38 so as to set the pressure in the inner space 12s to a designed pressure. In step STa, the controller 80 controls the high frequency power supplies 70A and 70B so as to generate the plasma of the fluorine-containing gas. That is, the controller 80 controls the high frequency power supplies 70A and 70B so as to supply high frequency source power. In step STa, the controller 80 may control the high frequency power supply 30 so as to supply high frequency bias power to the lower electrode 18.

Alternatively, in a case where the second region R2 is covered with the first region R1, step STa is executed in order to etch the first region R1 until the second region R2 is exposed, or just before the second region R2 is exposed. In this case, in step STa, any other sequence, which includes step ST1 and step ST3 without including step ST2, is executed.

In step ST1 of the sequence SQ, an active species from first plasma is supplied to the surface of the workpiece W. The time length of an execution period of step ST1 in a period, during which the sequence SQ is executed once, is set to a time length of 1 second or more and 100 seconds or less. Step ST1 may be executed in parallel with step ST2, or may not be executed in parallel with step ST2. In a case where step ST1 is not executed in parallel with step ST2, an active species from plasma P1 is supplied to the surface of the workpiece W, as illustrated in FIGS. 2B and 3B. The plasma P1 includes first plasma and does not include second plasma. In a case where step ST1 is executed in parallel with step ST2, an active species from plasma P12 is supplied to the surface of the workpiece W, as illustrated in FIG. 4B. The plasma P12 includes first plasma and second plasma.

By executing step ST1, as illustrated in FIGS. 2C, 3C and 4C, at least a portion of the first region R1, which includes the surface of the first region R1, is modified so that a modified region MR1 (first modified region) is formed. The first plasma modifies at least a portion of the first region R1 so that the etching rate of the modified region MR1 by third plasma to be described later is higher than the etching rate of the first region R1 by the third plasma. In a case of processing the workpiece W of the first example and the second example described above, the first plasma is plasma of a hydrogen-containing gas. That is, in a case of processing the workpiece W of the first example and the second example, the first plasma is hydrogen plasma. The hydrogen-containing gas is, for example, a $H_2$ gas and/or an $NH_3$ gas.

Figure 11:
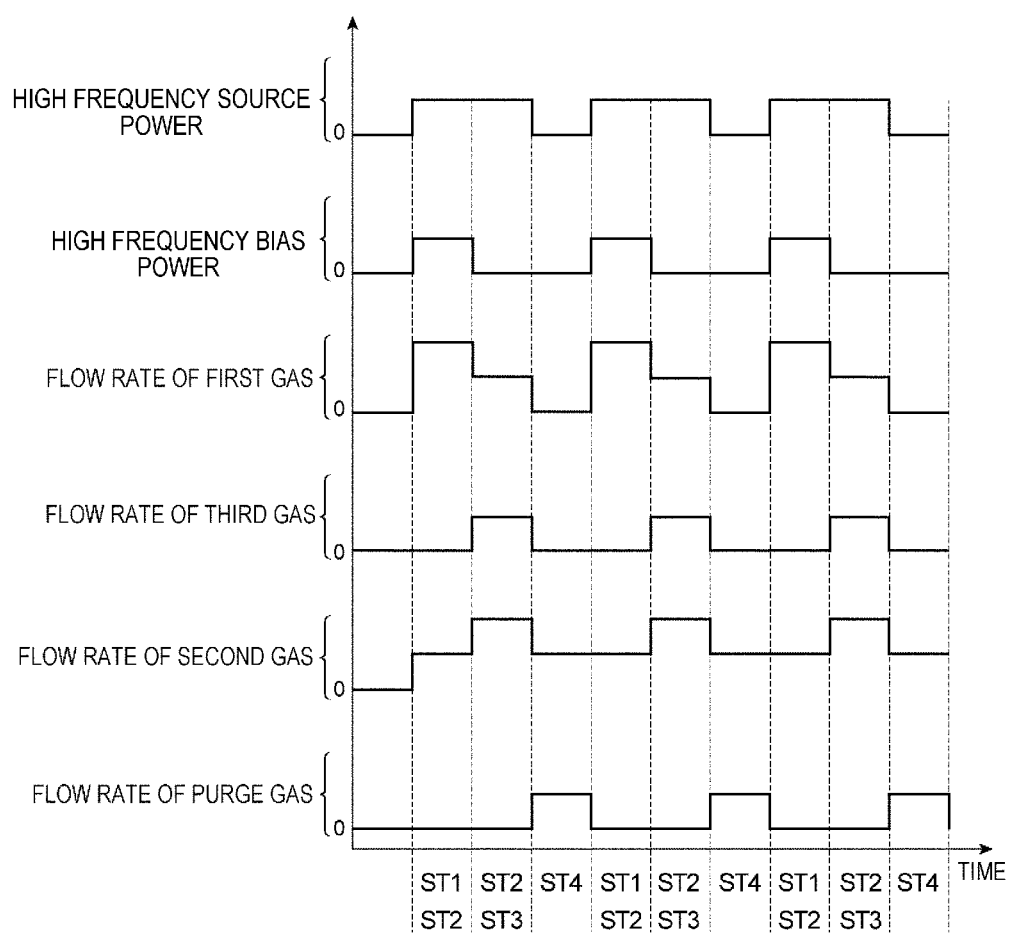
FIG. 11 is a timing chart related to method MT.
Figure 12:
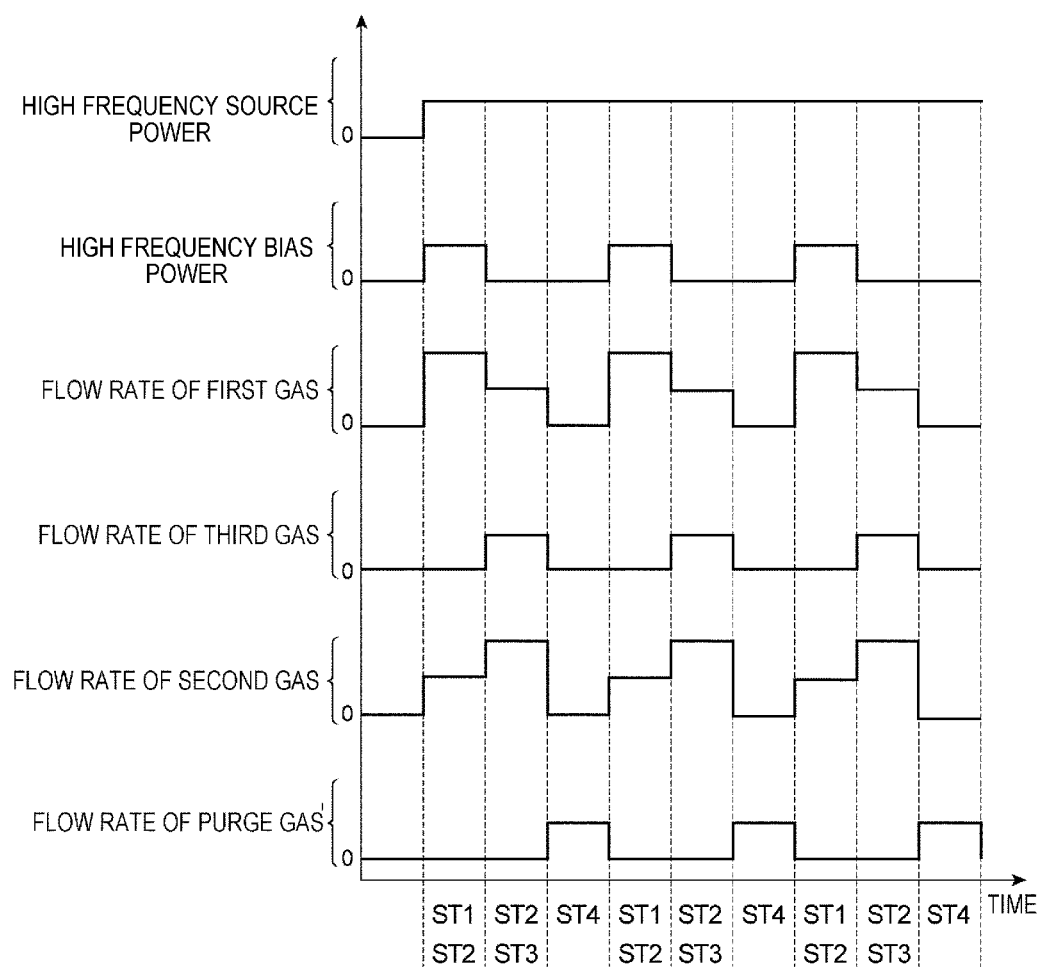
FIG. 12 is a timing chart related to method MT.
Figure 13:
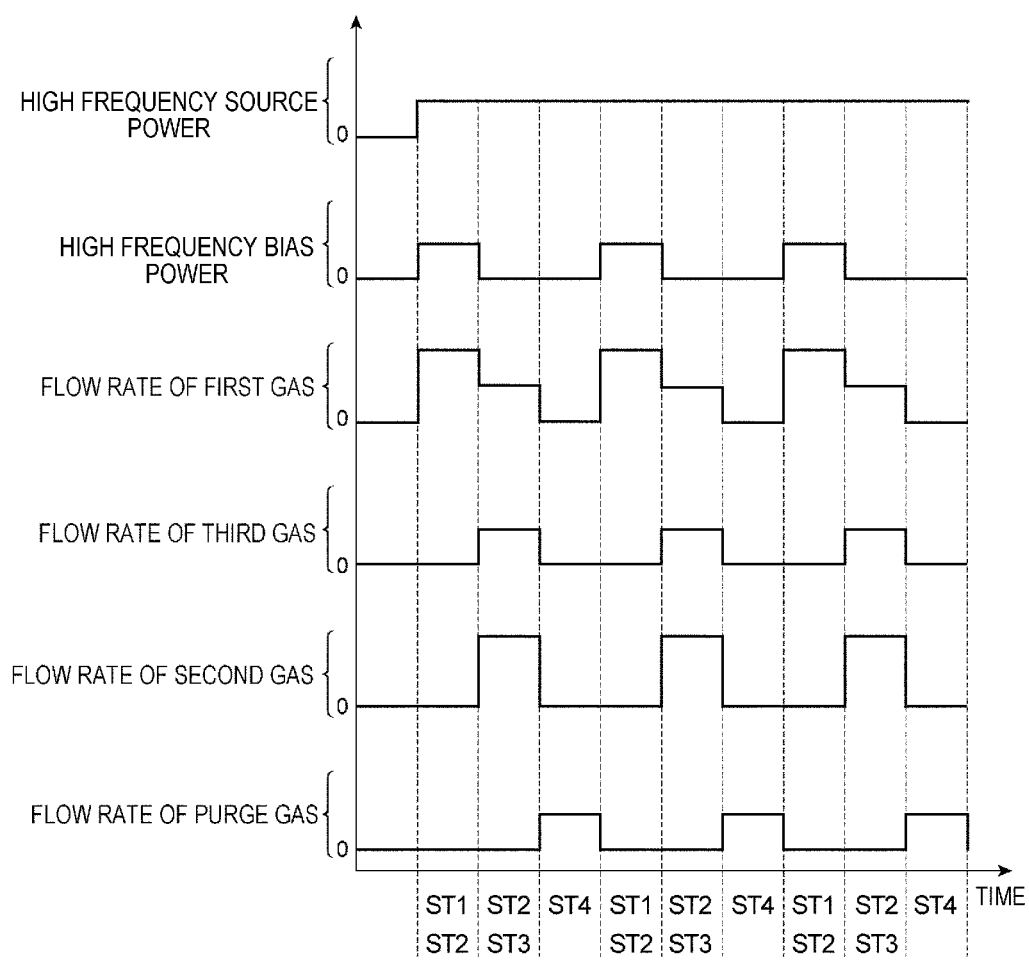
FIG. 13 is a timing chart related to method MT.

In step ST1, the controller 80 controls the gas supply unit 44 so as to supply a first gas to the inner space 12s. As illustrated in FIG. 13, in a case where step ST1 is not executed in parallel with step ST2, in step ST1, no second gas is supplied to the inner space 12s. As illustrated in FIGS. 9 to 12 and 14, in a case where step ST1 is executed in parallel with step ST2, the first gas is supplied to the inner space 12s together with a second gas.

In step ST1, the controller 80 controls the exhaust device 38 so as to set the pressure in the inner space 12s to a designated pressure. As illustrated in FIGS. 9 to 14, in step ST1, the controller 80 may control the high frequency power supply 30 so as to supply high frequency bias power to the lower electrode 18. In step ST1, the controller 80 may control the high frequency power supplies 70A and 70B so as to supply high frequency source power in order to generate plasma of the first gas, but the high frequency source power may not be supplied. That is, in step ST1, by supplying the high frequency bias power to the lower electrode 18, plasma may be generated without using any other high frequency wave. The high frequency source power in step ST1 may be set to power that is lower than the high frequency source power in step ST3. For the workpiece W having a diameter of 300 mm, the high frequency source power in step ST1 is set to, for example, power within the range from 0 W to 300 W, and the high frequency source power in step ST3 is set to, for example, power within the range from 300 W to 2000 W. In step ST1, the high frequency bias power is set to power that is higher than the high frequency bias power in step ST3 to be described later.

In this manner, by using the high frequency bias power as main high frequency power for the generation of plasma in step ST1, the density of plasma in the inner space 12s decreases, but the time resolution of the modified amount of the first region R1 (the thickness in the depth direction of the modified region MR1) is improved. In addition, when high frequency source power is used as the main high frequency power for the generation of plasma, the density of plasma in the inner space 12s has a distribution in which the density varies along the radial direction with respect to the central axis of the chamber 12. Meanwhile, when high frequency bias power is used as the main high frequency power for the generation of plasma in step ST1, the density of plasma in the inner space 12s has a uniform distribution in the radial direction. Thus, by using the high frequency bias power as the main high frequency power for the generation of plasma in step ST1, the in-plane uniformity of modification of the first region R1 is improved.

In step ST2 of the sequence SQ, an active species from second plasma is supplied to the surface of the workpiece W. Step ST2 may be executed in parallel with step ST1 and/or step ST3, and may not be executed in parallel with either step ST1 or step ST3. In a case where step ST2 is not executed in parallel with either step ST1 or step ST3, an active species from plasma P2 is supplied to the surface of the workpiece W, as illustrated in FIG. 3C. The plasma P2 includes second plasma and does not include first plasma. In a case where step ST2 is executed in parallel with step ST1, an active species from the plasma P12 is supplied to the surface of the workpiece W, as illustrated in FIG. 4B. The plasma P12 includes first plasma and second plasma. In a case where step ST2 is executed in parallel with step ST3, an active species from plasma P31 is supplied to the surface of the workpiece W, as illustrated in FIG. 5A. The plasma P31 includes second plasma and third plasma. In addition, plasma P32 to be described later, which is illustrated in FIG. 6A, may include second plasma, or may not include second plasma.

By executing step ST2, as illustrated in FIGS. 3D, 4C, and 5B, at least a portion of the second region R2, which includes the surface of the second region R2, is modified so that a modified region MR2 (second modified region) is formed. The second plasma modifies at least a portion of the second region R2, so that the etching rate of the modified region MR2 by third plasma to be described later is lower than the etching rate of the second region R2 by the third plasma. In a case of processing the workpiece W of the first example and the second example described above, the second plasma is plasma of an oxygen-containing gas. That is, in a case of processing the workpiece W of the first example and the second example, the second plasma is oxygen plasma. The oxygen-containing gas is, for example, any one of $O_2$ gas, CO gas, $CO_2$ gas, NO gas, $NO_2$ gas, $N_2O$ gas, and $SO_2$ gas, or a mixture gas including two or more of these gases.

In step ST2, the controller 80 controls the gas supply unit 44 so as to supply a second gas to the inner space 12s. In a case where step ST2 is not executed in parallel with either step ST1 or step ST3, in step ST2, a first gas and a third gas are not supplied to the inner space 12s. As illustrated in FIGS. 9 to 12 and 14, in a case where step ST2 is executed in parallel with step ST1, the second gas is supplied to the inner space 12s together with the first gas. As illustrated in FIGS. 9 to 14, in a case where step ST2 is executed in parallel with step ST3, the second gas is supplied to the inner space 12s together with the third gas.

In step ST2, the controller 80 controls the exhaust device 38 so as to set the pressure in the inner space 12s to a designated pressure. As illustrated in FIGS. 9 to 14, in a case where step ST2 is executed in parallel with step ST3, in step ST2, the controller 80 controls the high frequency power supplies 70A and 70B so as to supply high frequency source power in order to generate plasma of the second gas. As illustrated in FIGS. 9 to 14, in a case where step ST2 is executed in parallel with step ST3, in step ST2, the controller 80 sets high frequency bias power to power that is lower than the high frequency bias power in step ST1 (that may be 0 [W]).

In a case where step ST2 is not executed in parallel with step ST3, in step ST2, the controller 80 may control the high frequency power supply 30 so as to supply high frequency bias power to the lower electrode 18. In step ST2, the controller 80 may control the high frequency power supplies 70A and 70B so as to supply high frequency source power in order to generate plasma of the second gas, but the high frequency source power may not be supplied. That is, in a case where step ST2 is not executed in parallel with step ST3, in step ST2, by supplying the high frequency bias power to the lower electrode 18, plasma may be generated without using any other high frequency wave.

In step ST3 of the sequence SQ, an active species from third plasma is supplied to the surface of the workpiece W. The time length of an execution period of step ST3 in a period, during which the sequence SQ is executed once, is set to a time length of 1 second or more and 100 seconds or less. Step ST3 may be executed in parallel with step ST2, or may not be executed in parallel with step ST2. In a case where step ST3 is executed in parallel with step ST2, in step ST3, an active species from the plasma P31 is supplied to the surface of the workpiece W, as illustrated in FIG. 5B. The plasma P31 includes second plasma and third plasma. As described above, the active species from the second plasma modifies at least a portion of the second region R2 so as to form the modified region MR2. The active species from the third plasma selectively etches the modified region MR1 with respect to the modified region MR2.

In a case where step ST3 is not executed in parallel with step ST2, in step ST3, an active species from the plasma P32 is supplied to the surface of the workpiece W, as illustrated in FIG. 6B. The plasma P32 includes third plasma. The active species from the third plasma selectively etches the modified region MR1 with respect to the modified region MR2 that has already been formed. The plasma P32 may include second plasma, in addition to the third plasma.

In a case where the sequence SQ does not include step ST2, in step ST3, as illustrated in FIG. 7B, the modified region MR2 is not formed, and the modified region MR1 is selectively etched with respect to the second region R2. In addition, method MT in which the sequence SQ does not include step ST2 may be applied to the second example of the workpiece W described above.

The third plasma is plasma of a third gas. The third gas is a gas for selectively etching the modified region MR1. In a case of processing the workpiece W of the first example and the second example described above, the third gas is a fluorine-containing gas, for example, any one of $NF_3$ gas, $SF_6$ gas, and a fluorocarbon gas (e.g., $CF_4$ gas), or a mixture gas including two or more of these gases. That is, in a case of processing the workpiece W of the first example and the second example, the third plasma is fluorine plasma. In step ST3, in addition to the third gas, any other gas may be supplied to the inner space 12s. The other gas may be a rare gas and/or a hydrogen-containing gas. The hydrogen-containing gas is, for example, a $H_2$ gas and/or an $NH_3$ gas. In a case where a hydrogen-containing gas is used, in step ST3, hydrogen plasma is generated, so that an active species of fluorine from the hydrogen plasma is combined with an active species of fluorine, and the amount of active species of fluorine is adjusted.

In step ST3, the controller 80 controls the gas supply unit 44 so as to supply the third gas to the inner space 12s. In a case where step ST3 is not executed in parallel with step ST2, in step ST3, no second gas is supplied to the inner space 12s. As illustrated in FIGS. 9 to 14, in a case where step ST3 is executed in parallel with step ST2, the third gas is supplied to the inner space 12s together with the second gas. In addition, in a case where step ST2 is executed in parallel with step ST1 and step ST3, as illustrated in FIGS. 9 to 12 and 14, the flow rate of the second gas in step ST3 may be higher than the flow rate of the second gas in step ST2.

In step ST3, the controller 80 controls the exhaust device 38 so as to set the pressure in the inner space 12s to a designated pressure. As illustrated in FIGS. 9 to 14, in step ST3, the controller 80 controls the high frequency power supplies 70A and 70B so as to supply high frequency source power in order to generate plasma of the third gas. The high frequency bias power in step ST3 is supplied to the lower electrode 18, but is set to power that is lower than the high frequency bias power in step ST1 and step ST2. Alternatively, the high frequency bias power in step ST3 is set to 0 [W]. Thereby, the modified region MR1 is etched not by physical etching using ions, but by chemical etching using radicals from third plasma. Thus, the selectivity of etching of the modified region MR1 is improved.

Figure 9:
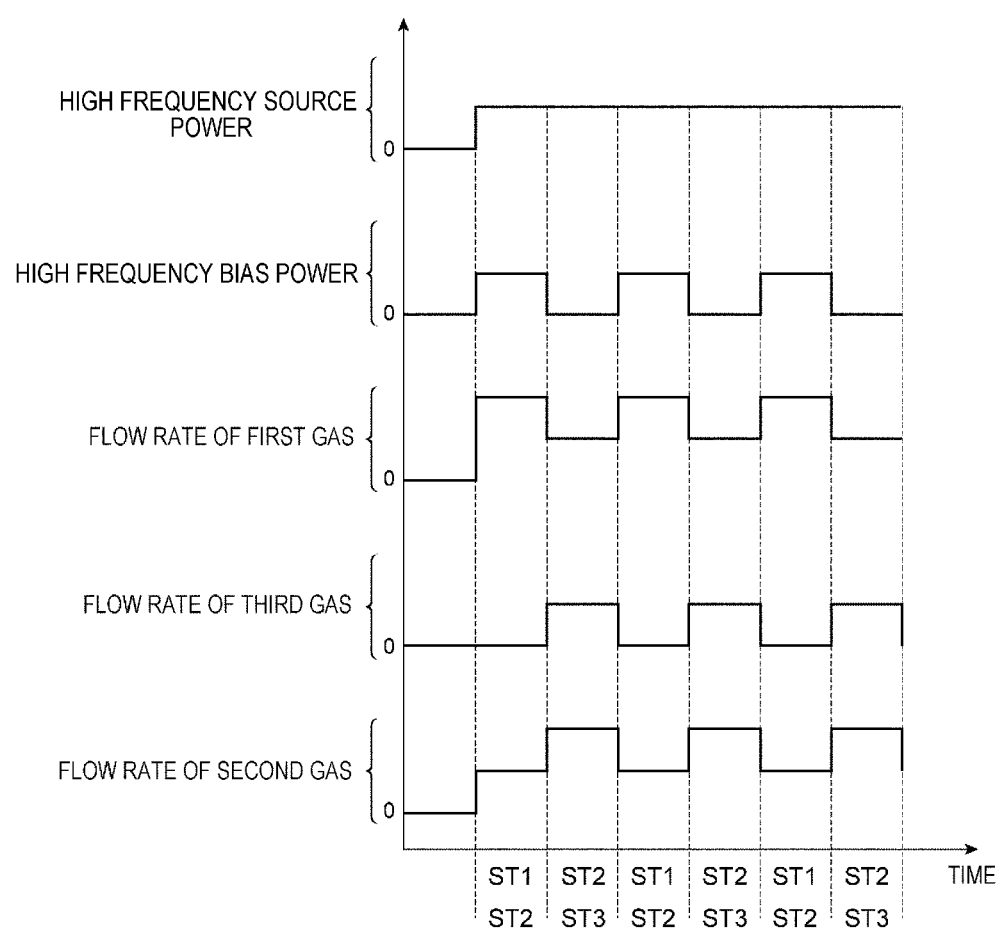
FIG. 9 is a timing chart related to method MT.

As illustrated in FIGS. 10 to 14, the sequence SQ may further include step ST4. In addition, as illustrated in FIG. 9, the sequence SQ of method MT may not include step ST4. As illustrated in FIGS. 10 to 14, step ST4 is executed after step ST3. In step ST4, purging of the inner space 12s is executed. Specifically, in step ST4, the third gas (e.g., a fluorine-containing gas) in the inner space 12s is exhausted. In step ST4, a purge gas is supplied to the inner space 12s. In the timing charts illustrated in FIGS. 9 to 13, the purge gas may be a first gas, an inert gas, or a mixture gas of the first gas and the inert gas. In the timing chart illustrated in FIG. 14, the first gas is used as the purge gas. The first gas is, for example, a hydrogen-containing gas. The hydrogen-containing gas is, for example, a $H_2$ gas and/or an $NH_3$ gas. The inert gas is, for example, a nitrogen gas and/or a rare gas. In step ST4, in a case where the purge gas includes the first gas, the flow rate of the first gas in step ST4 and the flow rate of the first gas in step ST1 may be the same. In a case where the purge gas includes the first gas in step ST4, the first gas may be continuously supplied within the sequence SQ.

In step ST4, plasma of the purge gas may be generated, or may not be generated. That is, in step ST4, high frequency source power from the high frequency power supply 70A, high frequency source power from the high frequency power supply 70B, and high frequency bias power from the high frequency power supply 30 may not be supplied. In step ST4, in addition to the purge gas, an oxygen-containing gas as a second gas may be supplied to the inner space 12s, or the oxygen-containing gas may not be supplied. In a case where the oxygen-containing gas is supplied to the inner space 12s, in addition to the purge gas, plasma is not generated in step ST4. In a case where plasma of the oxygen-containing gas is not generated in step ST4, oxidation damage to the workpiece W is prevented. In a case where the oxygen-containing gas is supplied to the inner space 12s, in addition to the purge gas, in step ST4, the flow rate of the oxygen-containing gas in step ST2 and the flow rate of the oxygen-containing gas in step ST4 may be the same.

Figure 10:
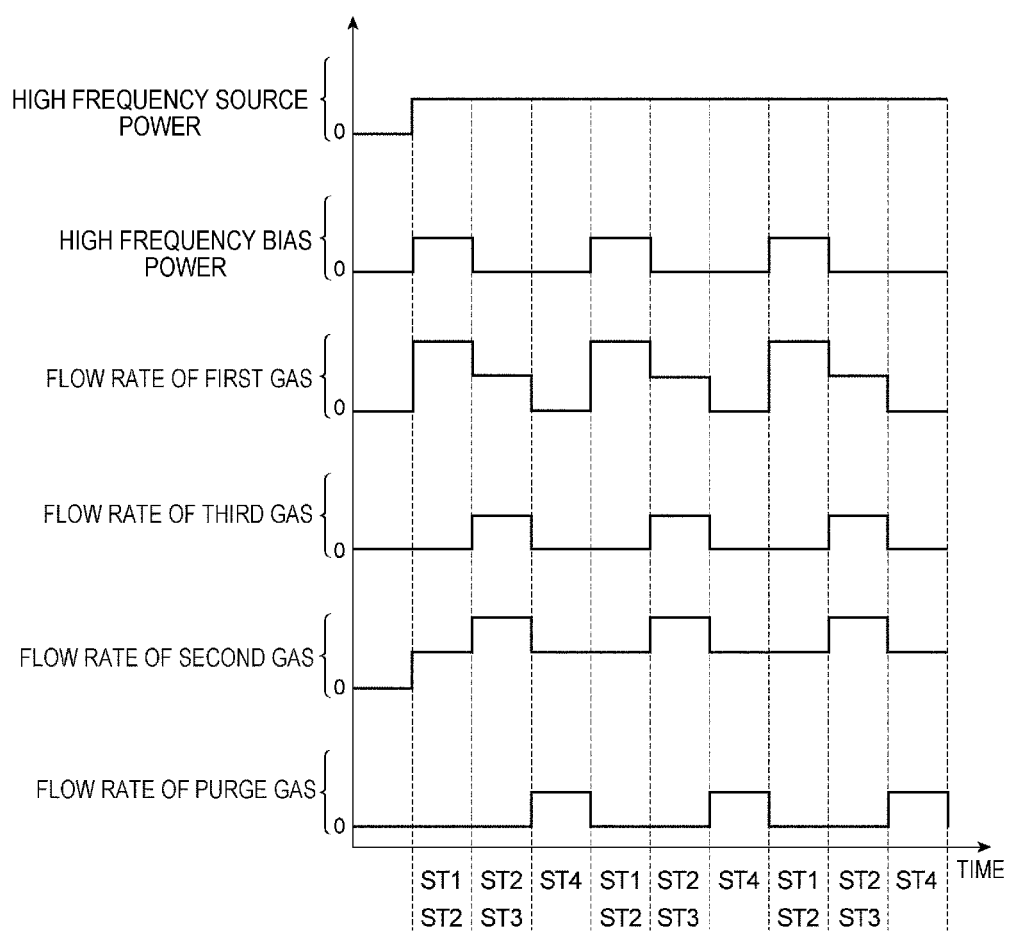
FIG. 10 is a timing chart related to method MT.
Figure 14:
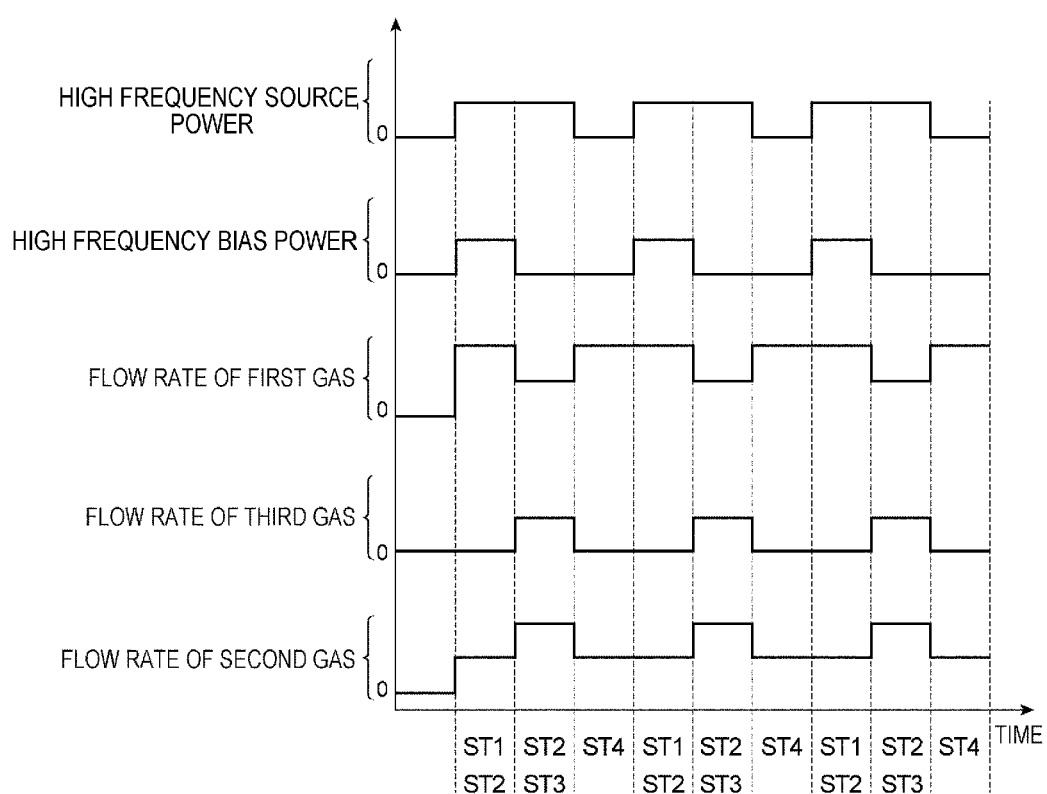
FIG. 14 is a timing chart related to method MT.

In step ST4, the controller 80 controls the gas supply unit 44 so as to supply the purge gas to the inner space 12s. In step ST4, the controller 80 controls the exhaust device 38 so as to evacuate the gas in the inner space 12s. As illustrated in FIGS. 10, 12 and 13, in step ST4, the controller 80 may control the high frequency power supplies 70A and 70B so as to supply high frequency source power. In addition, as illustrated in FIGS. 11 and 14, in step ST4, the controller 80 may control the high frequency power supplies 70A and 70B so as not to supply high frequency source power. In addition, as illustrated in FIGS. 10 to 14, in step ST4, the controller 80 may control the high frequency power supply 30 so as not to supply high frequency bias power.

In method MT, step ST5 is executed after execution of the sequence SQ. In step ST5, it is determined whether or not a stop condition is satisfied. The stop condition is satisfied when the number of times the sequence SQ is executed has reached a predetermined number of times. When it is determined in step ST5 that the stop condition is not satisfied, the sequence SQ is executed again. When the sequence SQ is repeatedly executed, as illustrated in FIGS. 5C, 6C and 7C, the first region R1 is selectively etched with respect to the second region R2 so that the second region R2 is left. When it is determined that the stop condition is satisfied in step ST5, method MT ends. In addition, when the number of times the sequence SQ is executed is 1, step ST5 is unnecessary.

In a case where the workpiece W of the first example described above is processed by method MT, at least a portion of the first region R1 is modified by an active species of hydrogen so that the modified region MR1 is formed by execution of step ST1. The modified region MR1 is more easily etched by an active species of fluorine than the first region R1. In addition, at least a portion of the second region R2 is modified by an active species of oxygen so that the modified region MR2 is formed by execution of step ST2. The modified region MR2 is more difficult to be etched by the active species of fluorine than the second region R2. Thus, in step ST3, the modified region MR1 is selectively etched with respect to the modified region MR2 by the active species of fluorine. That is, according to method MT, the first region R1 is selectively etched with respect to the second region R2. In addition, the etching rate of the first region R1 in method MT may be 10 times or more the etching rate of the second region R2. That is, the selectivity in method MT may be 10 or more. In addition, the active species in the plasma used in method MT have considerably low deposition ability, or have substantially no deposition ability. Thus, according to method MT, generation of a deposit on the workpiece W is prevented.

Similarly, in a case where the workpiece W of the second example described above is processed by method MT, at least a portion of the first region R1 is modified by an active species of hydrogen so that the modified region MR1 is formed. The modified region MR1 is more easily etched by an active species of fluorine than the first region R1. On the other hand, the second region R2 is hardly modified by the active species of hydrogen. Thus, the modified region MR1 is selectively etched by the active species of fluorine with respect to the second region R2. That is, according to method MT, the first region R1 is selectively etched with respect to the second region R2. In addition, the active species in the plasma used in method MT have considerably low deposition ability, or have substantially no deposition ability. Thus, according to method MT, generation of a deposit on the workpiece W is prevented. In addition, even in a case where the workpiece W of the second example is processed by method MT, step ST2 may be executed within the sequence SQ. In step ST2, the above-described oxygen-containing gas is used as the second gas.

In an embodiment, while the sequence SQ is repeated, at least one of the execution time length TD1 of step ST1, the execution time length TD2 of step ST2, and the execution time length TD3 of step ST3 may be changed. In a case where the sequence SQ does not include step ST2, at least one of the execution time length TD1 of step ST1 and the execution time length TD3 of step ST3 may be changed.

For example, the value TD3/TD1 of the ratio of the execution time length TD3 of step ST3 to the execution time length TD1 of step ST1 in the sequence SQ that is executed when the aspect ratio of an opening formed by etching the first region R1 is large, may be larger than the value TD3/TD1 of the ratio of the execution time length TD3 of step ST3 to the execution time length TD1 of step ST1 in the sequence SQ that is executed when the first region R1 is not yet etched or when the aspect ratio of the opening formed by etching the first region R1 is small. When the aspect ratio is large, since the modified region MR1 exists at the bottom portion of a deep opening, it is difficult for radicals (e.g., fluorine radical) from the plasma of the third gas to reach the modified region MR1. By adjusting the value TD3/TD1 of the ratio as described above, it is possible to supply a relatively large amount of radicals to the modified region MR1, which exists at the bottom portion of a deep opening. In addition, "TD3/TD1" may be increased by decreasing the execution time length TD1 of step ST1, by increasing the execution time length TD1 of step ST3, or by both.

In another example, the execution time length of step ST1 in the sequence SQ that is executed for a period, during which the amount of etching needs to be precisely controlled, may be shorter than the execution time length of step ST1 in the sequence SQ that is executed for any other period. The period during which the amount of etching needs to be precisely controlled is, for example, a period that includes a point in time at which another region in which etching needs to be prevented is exposed (e.g., a period that includes the end point of etching of the first region R1).

In addition, the high frequency source power set in step ST3 in the sequence SQ that is executed when the aspect ratio is large may be greater than the high frequency source power set in step ST3 in the sequence SQ that is executed when the first region R1 is not yet etched or when the aspect ratio of the opening formed by etching the first region R1 is small. In a case where the high frequency source power is large, the amount of radicals generated increases, whereby it is possible to supply a relatively large amount of radicals to the bottom portion of a deep opening.

In an embodiment, the second region R2 is covered with the first region R1. In this case, the sequence SQ that includes step ST1 to step ST3 or that includes step ST1 to step ST4 may be executed for a period that includes a point in time immediately after the exposure of the second region R2 or a point in time at which the second region R2 is exposed. In this case, step STa is executed in order to etch the first region R1 until the second region R2 is exposed or just before the second region R2 is exposed. In step STa, any other sequence that includes step ST1 and step ST3 or that includes step ST1, step ST3, and step ST4, but does not include step ST2 is executed. According to this embodiment, the execution time length of step ST2 is omitted by executing step STa, and the etching of the second region R2 is prevented by executing the sequence SQ.

Hereinafter, method MT that is executed on the workpieces of third to fifth examples will be described. FIG. 15A is a partially enlarged cross-sectional view of a workpiece of a third example, FIG. 15B is a partially enlarged cross-sectional view of the workpiece of the third example after execution of step ST1, FIG. 15C is a partially enlarged cross-sectional view of the workpiece of the third example after execution of step ST3, FIG. 15D is a partially enlarged cross-sectional view of the workpiece of the third example after execution of step ST2 and step ST3, and FIG. 15E is a partially enlarged cross-sectional view of the workpiece of the third example after further execution of step ST3.

The workpiece W3 of the third example illustrated in FIG. 15A is a modification of the workpiece W of the above-described first example. The workpiece W3 includes the first region R1 and the second region R2. In the workpiece W3, the first region R1 includes silicon and nitrogen, and the second region R2 includes silicon and/or germanium. In the workpiece W3, the first region R1 is formed of silicon nitride, silicon oxynitride, or silicon carbonitride. In the workpiece W3, the second region R2 is formed of, for example, silicon, germanium, or silicon germanium.

The workpiece W3 further includes a third region R3. The third region R3 may be formed of an arbitrary material. The third region R3 is formed of, for example, silicon oxide. The second region R2 is provided so as to protrude from the third region R3. The first region R1 is provided so as to cover the second region R2 and the third region R3. In addition, the workpiece W3 may be an intermediate product obtained during the manufacture of a Fin field effect transistor. In this case, the second region R2 is used as a fin region that provides a source region, a drain region, and a channel region.

In method MT executed on the workpiece W3, the above-described hydrogen-containing gas is used as a first gas, the above-described oxygen-containing gas is used as a second gas, and the above-described fluorine-containing gas is used as a third gas. In the sequence SQ of method MT executed on the workpiece W3, step ST2 may be executed in parallel with step ST1, step ST3, or both step ST1 and step ST3. The sequence SQ of method MT executed on the workpiece W3 may further include step ST4. Method MT to be executed on the workpiece W3 is executed, for example, according to any one of the timing charts of FIGS. 9 to 14.

By executing step ST1 of the sequence SQ, a portion of the first region R1, which includes the surface of the first region R1, is modified so that the modified region MR1 is formed, as illustrated in FIG. 15B. By executing step ST3, the modified region MR1 is etched, as illustrated in FIG. 15C. When the first region R1 is etched to expose the second region R2, a portion of the second region R2, which includes the surface of the second region R2, is modified by the active species generated in step ST2 of the sequence SQ so that the modified region MR2 is formed. Thus, even if step ST3 is executed to etch the modified region MR1, the second region R2 is protected by the modified region MR2, as illustrated in FIG. 15D, whereby etching of the second region R2 is prevented. By repeatedly executing the sequence SQ, as illustrated in FIG. 15E, the first region R1 is selectively etched so that the second region R2 is left.

In addition, similarly, in method MT executed on the workpiece W3, the sequence SQ that includes step ST1 to step ST3 or that includes step ST1 to step ST4 may be executed for a period that includes a point in time immediately after the exposure of the second region R2, or a period that includes a point in time at which the second region R2 is exposed. In this case, step STa is executed in order to etch the first region R1 until the second region R2 is exposed or just before the second region R2 is exposed. In step STa, any other sequence that includes step ST1 and step ST3 or that includes step ST1, step ST3, and step ST4, but does not include step ST2 is executed.

FIG. 16A is a partially enlarged cross-sectional view of a workpiece of a fourth example, FIG. 16B is a partially enlarged cross-sectional view of the workpiece of the fourth example after execution of step ST1, FIG. 16C is a partially enlarged cross-sectional view of the workpiece of the fourth example after execution of step ST3, FIG. 16D is a partially enlarged cross-sectional view of the workpiece of the fourth example after further execution of step ST1, and FIG. 16E is a partially enlarged cross-sectional view of the workpiece of the fourth example after the execution of step ST2 and step ST3.

The workpiece W4 of the fourth example illustrated in FIG. 16A is another modification of the workpiece W of the above-described first example. The workpiece W4 includes the first region R1 and the second region R2. In the workpiece W4, the first region R1 includes silicon and nitrogen, and the second region R2 includes silicon and/or germanium. In the workpiece W4, the first region R1 is formed of silicon nitride, silicon oxynitride, or silicon carbonitride. In the workpiece W4, the second region R2 is formed of, for example, silicon, germanium, or silicon germanium.

The workpiece W4 further includes the third region R3. The third region R3 may be formed of an arbitrary material. The third region R3 is formed of, for example, silicon oxide. In the workpiece W4, the first region R1 is provided on the second region R2. In the workpiece W4, the third region R3 is provided around the first region R1 and the second region R2. The workpiece W4 further includes a patterned region MK. The region MK is provided on the third region R3. The region MK is, for example, a mask. The region MK includes a metal. The region MK is patterned so as to provide an opening. The third region R3 provides an opening that is continuous with the opening in the region MK so as to expose the first region R1 from the opening.

The third region R3 may cover the first region R1 before the cross-sectional structure that is in the state illustrated in FIG. 16A is obtained. In this case, in method MT, step STa is executed so that an opening is formed in the third region R3 so as to expose the first region R1. In a case where the third region R3 is formed of silicon oxide, in step STa, plasma of a fluorine-containing gas is generated. The fluorine-containing gas may be a fluorocarbon gas (e.g., $C_4F_6$ gas). In step STa, in addition to the fluorine-containing gas, other gases such as an oxygen gas and a rare gas may further be used.

In method MT executed on the workpiece W4, the above-described hydrogen-containing gas is used as a first gas, the above-described oxygen-containing gas is used as a second gas, and the above-described fluorine-containing gas is used as a third gas. In the sequence SQ of method MT executed on the workpiece W4, step ST2 may be executed in parallel with step ST3, or both step ST1 and step ST3. The sequence SQ of method MT executed on the workpiece W4 may further include step ST4. Method MT to be executed on the workpiece W4 is executed, for example, according to any one of the timing charts of FIGS. 9 to 14.

By executing step ST1 of the sequence SQ, a portion of the first region R1, which includes the surface of the first region R1, is modified so that the modified region MR1 is formed, as illustrated in FIG. 16B. By executing step ST3, the modified region MR1 is etched, as illustrated in FIG. 16C. By further executing step ST1, the modified region MR1 is further formed from the first region R1, as illustrated in FIG. 16D. When the second region R2 is exposed, a portion of the second region R2, which includes the surface of the second region R2, is modified by the active species generated in step ST2 so as to form the modified region MR2, as illustrated in FIG. 16E. Thus, during the execution of step ST3, the second region R2 is protected by the modified region MR2, whereby etching of the second region R2 is prevented.

In addition, similarly, in method MT executed on the workpiece W4, the sequence SQ that includes step ST1 to step ST3 or that includes step ST1 to step ST4 may be executed for a period that includes a point in time immediately after the second region R2 is exposed, or a period that includes a point in time at which the second region R2 is exposed. In this case, a sequence that includes step ST1 and step ST3 or that includes step ST1, step ST3, and step ST4, but does not include step ST2 is executed in order to etch the first region R1 until the second region R2 is exposed or immediately before the second region R2 is exposed.

FIG. 17A is a partially enlarged cross-sectional view of a workpiece of a fifth example, FIG. 17B is a partially enlarged cross-sectional view of the workpiece of the fifth example after execution of step ST1, FIG. 17C is a partially enlarged cross-sectional view of the workpiece of the fifth example after execution of step ST1 and step ST2, FIG. 17D is a partially enlarged cross-sectional view of the workpiece of the fifth example after execution of step ST3, and FIG. 17E is a partially enlarged cross-sectional view of the workpiece of the fifth example after execution of step ST3.

The workpiece W5 of the fifth example illustrated in FIG. 17A is another modification of the workpiece W of the second example described above. The workpiece W5 includes the first region R1 and the second region R2. In the workpiece W5, the second region R2 is provided on the first region R1. In the workpiece W5, the second region R2 is patterned so as to provide an opening in the first region R1. In the workpiece W5, the first region R1 includes silicon and nitrogen, and the second region R2 includes a metal. In the workpiece W5, the first region R1 is formed of, for example, silicon nitride, silicon oxynitride, or silicon carbonitride. In the workpiece W5, the second region R2 is formed of, for example, titanium, titanium nitride, titanium oxide, tungsten, tungsten carbide, ruthenium, hafnium, hafnium oxide, zirconium, zirconium oxide, or tantalum.

In method MT executed on the workpiece W5, the above-described hydrogen-containing gas is used as a first gas, and the above-described fluorine-containing gas is used as a third gas. In method MT executed on the workpiece W5, step ST2 may be executed, or may not be executed. In a case where step ST2 is executed in method MT executed on the workpiece W5, the above-described oxygen-containing gas is used as a second gas. In a case where step ST2 is executed in method MT executed on the workpiece W5, in the sequence SQ, step ST2 may be executed in parallel with step ST1, step ST3, or both step ST1 and step ST3. The sequence SQ of method MT executed on the workpiece W5 may further include step ST5. Method MT to be executed on the workpiece W5 is executed, for example, according to any one of the timing charts of FIGS. 9 to 14.

By executing step ST1 of the sequence SQ, a portion of the first region R1, which includes the surface of the first region R1, is modified so that the modified region MR1 is formed, as illustrated in FIG. 17B. In a case where step ST1 and step ST2 are executed in parallel with each other, as illustrated in FIG. 17C, a portion of the first region R1, which includes the surface of the first region R1, is modified so as to form the modified region MR1, and a portion of the second region R2, which includes the surface of the second region R2, is modified so as to form the modified region MR2. Then, by executing step ST3, the modified region MR1 is selectively etched from the workpiece W5 illustrated in FIG. 17B (see FIG. 17D). Alternatively, by executing step ST3, the modified region MR1 is selectively etched from the workpiece W5 illustrated in FIG. 17C (see FIG. 17E). Thus, according to method MT executed on the workpiece W5, the first region R1 is selectively etched with respect to the second region R2.

While various embodiments have been described above, various modifications may be made without being limited to the above-described embodiments. For example, the plasma processing apparatus 10 of the above-described embodiment is an inductively coupled plasma processing apparatus, but the plasma processing apparatus used for selectively etching the first region R1 and the second region R2 may include a capacitively coupled plasma generation unit, a plasma generation unit using electron cyclotron resonance, or a plasma generation unit using surface waves such as microwaves. In addition, the plasma processing apparatus may include an ion trap that captures ions from plasma between the plasma and the workpiece.

In addition, in the above-described embodiments, all of the processes are performed using the plasma processing apparatus 10, but at least one step of method MT may be executed in a plasma processing apparatus that is different from the plasma processing apparatus used in the other steps of method MT. Alternatively, all of the steps of method MT may be executed in different plasma processing apparatuses, respectively.

In addition, as the above-described first gas, a helium gas may be used instead of a hydrogen-containing gas. That is, plasma of a helium gas may be used as plasma of a gas for forming the modified region MR1 by modifying the first region R1 in step ST1. In addition, hydrogen in a hydrogen-containing gas may form the modified region MR1, which is easily selectively etched with respect to any other region, by cutting the bond between silicon and nitrogen in the first region. However, hydrogen in the hydrogen-containing gas may cause unacceptable damage to the region in which the hydrogen is accommodated in some cases. On the other hand, since helium has low chemical reactivity, it is possible to prevent damage to the region in which helium is accommodated. In addition, helium makes it possible to enhance the controllability of the depth, to which helium is introduced into the first region R1, due to the difference from the ionic radius of helium and the ionic radius of hydrogen.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:
1. A method of etching a substrate, the method comprising:
    providing a substrate including a first region and a second region, the first region including silicon and nitrogen, and the second region including silicon and/or germanium;
    modifying at least a portion of the first region, which includes a surface of the first region, using a hydrogen plasma, to form a first modified region from the at least a portion of the first region;
    modifying at least a portion of the second region, which includes a surface of the second region, using an oxygen plasma, to form a second modified region from the at least a portion of the second region;
    selectively etching the first modified region with respect to the second modified region using a fluorine plasma; and
    repeatedly executing a sequence including the modifying at least a portion of the first region, the modifying the at least a portion of the second region, and the selectively etching the first modified region.

2. The method of claim 1, wherein the modifying at least a portion of the second region is executed in parallel with at least one of the modifying at least a portion of the first region or the selectively etching the first modified region.

3. The method of claim 1, wherein, in the repeatedly executing of the sequence, at least one of an execution time length of the modifying at least a portion of the first region, an execution time length of the modifying at least a portion of the second region, or an execution time length of the selectively etching the first modified region is changed.

4. The method of claim 1, wherein the second region is covered with the first region.

5. The method of claim 4, wherein the sequence is executed for a period that includes a time point at which the second region is exposed.

6. The method of claim 1, further including performing the method in a plasma processing apparatus, which includes a chamber and a support table located in the chamber, wherein the modifying at least a portion of the first region, the modifying at least a portion of the second region, and the selectively etching the first modified region are executed in a state where the substrate is placed on the support table, and
    the sequence further includes purging an inner space of the chamber after the selectively etching the first modified region.

7. The method of claim 6, wherein, a hydrogen-containing gas is supplied to the inner space in the purging.

8. The method of claim 7, further including continuously supplying the hydrogen-containing gas to the inner space of the chamber while the sequence is executed.

9. The method of claim 6, wherein no plasma is generated during the purging.

10. The method of claim 1, further including performing the method in a plasma processing apparatus, which includes a chamber and a support table located in the chamber, wherein the modifying at least a portion of the first region and the selectively etching the first modified region are executed in a state where the substrate is placed on the support table,
    the support table includes a lower electrode, to which a high frequency bias power is supplied in order to introduce ions into the substrate, and
    the method further includes applying the high frequency bias power in the modifying at least a portion of the first region at a power level which is greater than a power level of the high frequency bias power in the selectively etching the first modified region.

11. The method of claim 10, further including generating a hydrogen plasma during the selectively etching the first modified region.

12. The method of claim 1, wherein a selectivity, which is a ratio of an etching rate of the first modified region to an etching rate of the second modified region, is equal to or greater than 10.

13. A method of etching a substrate, the method comprising:
- providing a substrate including a first region and a second region, the first region including silicon and nitrogen, and the second region including a metal;
- modifying at least a portion of the first region, which includes a surface of the first region, using a hydrogen plasma, to form a first modified region from the at least a portion of the first region;
- modifying at least a portion of the second region, which includes a surface of the second region, using an oxygen plasma to form a second modified region;
- selectively etching the first modified region with respect to the second modified region using a fluorine plasma; and
- repeatedly executing a sequence including the modifying at least a portion of the first region, the modifying at least a portion of the second region, and the selectively etching the first modified region.

14. A method of etching a substrate, the method comprising:
- providing a substrate including a first region and a second region;
- modifying at least a portion of the first region, which includes a surface of the first region, using a first plasma, to form a first modified region from the at least a portion of the first region;
- modifying at least a portion of the second region, which includes a surface of the second region, using a second plasma, to form a second modified region from the at least a portion of the second region;
- selectively etching the first modified region with respect to the second modified region using a third plasma; and
- repeatedly executing a sequence including the modifying at least a portion of the first region, the modifying the at least a portion of the second region, and the selectively etching the first modified region,
- wherein the first plasma modifies the at least a portion of the first region so as to increase an etching rate of the first modified region by the third plasma as compared to an etching rate of the first region by the third plasma, and
- the second plasma modifies the at least a portion of the second region so as to reduce an etching rate of the second modified region by the third plasma as compared to an etching rate of the second region by the third plasma.

15. The method of claim 2, wherein the modifying of the second region partially overlaps with the modifying of the first region, and wherein the modifying of the second region also partially overlaps with the selectively etching of the first modified region.

16. The method of claim 15, wherein the modifying of the first region is not performed during the selectively etching of the first modified region.

* * * * *